(12) United States Patent
Seo et al.

(10) Patent No.: US 11,985,854 B2
(45) Date of Patent: *May 14, 2024

(54) DISPLAY PANEL AND DISPLAY APPARATUS INCLUDING THE SAME

(71) Applicant: SAMSUNG DISPLAY CO., LTD., Yongin-si (KR)

(72) Inventors: Woori Seo, Yongin-si (KR); Injun Bae, Yongin-si (KR); Donghwi Kim, Yongin-si (KR); Chulho Kim, Yongin-si (KR); Yunhwan Park, Yongin-si (KR); Dongbeom Lee, Yongin-si (KR); Jin Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/719,418

(22) Filed: Dec. 18, 2019

(65) Prior Publication Data

US 2020/0286972 A1    Sep. 10, 2020

(30) Foreign Application Priority Data

Mar. 6, 2019    (KR) .................. 10-2019-0025860

(51) Int. Cl.
*H01L 51/00*    (2006.01)
*G09G 3/3225*    (2016.01)
(Continued)

(52) U.S. Cl.
CPC ....... *H10K 59/1213* (2023.02); *G09G 3/3225* (2013.01); *G09G 3/3266* (2013.01);
(Continued)

(58) Field of Classification Search
USPC ........................................... 257/43
(Continued)

(56) References Cited

U.S. PATENT DOCUMENTS 9,196,737 B2   11/2015   Zhan
9,268,428 B2    2/2016   Kim et al.
(Continued)

FOREIGN PATENT DOCUMENTS

JP         2016-534390       11/2016
KR      10-2010-0086256 A     7/2010
(Continued)

*Primary Examiner* — Hrayr A Sayadian
(74) *Attorney, Agent, or Firm* — F. CHAU & ASSOCIATES, LLC

(57) ABSTRACT

A display panel includes: a substrate that includes a display area and a sensor area, where the display area includes a main pixel and the sensor area includes an auxiliary pixel, where the main pixel is electrically connected to a main pixel circuit and the auxiliary pixel is electrically connected to an auxiliary pixel circuit, where the auxiliary pixel circuit includes a first auxiliary thin film transistor that includes a first semiconductor layer that includes an oxide semiconductor material and a first gate electrode that overlaps the first semiconductor layer, and a second auxiliary thin film transistor that including a second semiconductor layer that includes Low Temperature Poly-Silicon (LTPS) and a second gate electrode that overlaps the second semiconductor layer.

20 Claims, 9 Drawing Sheets

(51) Int. Cl.
    *G09G 3/3266*   (2016.01)
    *H10K 59/121*   (2023.01)
    *H10K 59/131*   (2023.01)
    *H10K 77/10*    (2023.01)
    *H01L 27/12*    (2006.01)

(52) U.S. Cl.
    CPC ....... *H10K 59/1216* (2023.02); *H10K 59/131* (2023.02); *H10K 77/10* (2023.02); *G09G 2300/0426* (2013.01); *G09G 2300/0439* (2013.01); *H01L 27/1225* (2013.01); *H01L 27/1255* (2013.01)

(58) Field of Classification Search
    IPC ........ H01L 27/3276, 27/3234, 27/3262, 27/326, 27/3265, 27/1225, 2251/303, 27/1255; G09G 3/3266, 3/3225, 2300/0443, 2300/0452, 2300/0439, 2300/0426, 3/3233; Y02E 10/549
    See application file for complete search history.

(56) References Cited

U.S. PATENT DOCUMENTS

| | | | |
|---|---|---|---|
| 9,871,526 | B2 | 1/2018 | Kurokawa |
| 10,186,191 | B2 | 1/2019 | Kang et al. |
| 10,186,528 | B2 | 1/2019 | Lee et al. |
| 11,271,055 | B2 * | 3/2022 | Bae ................ H10K 59/131 |
| 11,404,512 | B2 * | 8/2022 | Kim ................ H10K 59/17 |
| 2010/0182223 | A1 | 7/2010 | Choi et al. |
| 2015/0021594 | A1 * | 1/2015 | Yamada ........... H01L 27/14658 257/66 |
| 2017/0004798 | A1 * | 1/2017 | Park .................... G09G 3/3677 |
| 2018/0129328 | A1 | 5/2018 | Park et al. |
| 2019/0006394 | A1 | 1/2019 | Gupta et al. |

FOREIGN PATENT DOCUMENTS

| | | |
|---|---|---|
| KR | 10-2014-0102561 A | 8/2014 |
| KR | 10-2015-0101409 | 9/2015 |
| KR | 10-1733755 | 5/2017 |
| KR | 10-2017-0065059 A | 6/2017 |
| KR | 10-2018-0050473 | 5/2018 |
| KR | 10-1854187 | 5/2018 |

* cited by examiner

DISPLAY PANEL AND DISPLAY APPARATUS INCLUDING THE SAME

CROSS-REFERENCE TO RELATED APPLICATION

This application claims priority under 35 U.S.C. § 119 from, and the benefit of, Korean Patent Application No. 10-2019-0025860, filed on Mar. 6, 2019 in the Korean Intellectual Property Office, the contents of which are herein incorporated by reference in their entirety.

BACKGROUND

1. Technical Field

One or more embodiments are directed to a display panel and a display apparatus which includes the display panel, and more particularly, to a display panel in which a display area is enlarged to allow image display in a sensor area, and a display apparatus that includes the display panel.

2. Discussion of the Related Art

Recently, display apparatuses have been used for various purposes. In addition, due to decreased thicknesses and lightweight thereof, display apparatuses tend to be more widely used.

According to various uses and increased functionality of display apparatuses, there are many methods of designing the form or look of a display apparatus.

SUMMARY

As a method of increasing the functionality of a display apparatus, one or more embodiments include a display apparatus that includes, in an inner portion of a display area, a sensor area in which sensors, etc., can be arranged.

Additional aspects will be set forth in part in the description which follows and, in part, will be apparent from the description, or may be learned by practice of the presented embodiments.

According to one or more embodiments, a display panel includes: a substrate that includes a display area and a sensor area, where the display area includes a main pixel and the sensor area includes an auxiliary pixel, where the main pixel is electrically connected to a main pixel circuit and the auxiliary pixel is electrically connected to an auxiliary pixel circuit, where the auxiliary pixel circuit includes a first auxiliary thin film transistor that includes a first semiconductor layer that includes an oxide semiconductor material and a first gate electrode that overlaps the first semiconductor layer, and a second auxiliary thin film transistor that includes a second semiconductor layer that includes Low Temperature Poly-Silicon (LTPS) and a second gate electrode that overlaps the second semiconductor layer.

According to a present embodiment, the first auxiliary thin film transistor drives the auxiliary pixel, and the second auxiliary thin film transistor includes a switching thin film transistor that transmits a data signal to the first auxiliary thin film transistor.

According to a present embodiment, the auxiliary pixel circuit further includes a third auxiliary thin film transistor that diode-connects the first auxiliary thin film transistor, and the third auxiliary thin film transistor further includes a third semiconductor layer that includes an oxide semiconductor material and a third gate electrode that overlaps the third semiconductor layer.

According to a present embodiment, the auxiliary pixel circuit further includes a fourth auxiliary thin film transistor that initializes a voltage of the first gate electrode of the first auxiliary thin film transistor, and the fourth auxiliary thin film transistor includes a fourth semiconductor layer that includes an oxide semiconductor material and a fourth gate electrode that overlaps the fourth semiconductor layer.

According to a present embodiment, the first semiconductor layer, the third semiconductor layer, and the fourth semiconductor layer are integrally formed on a same layer.

According to a present embodiment, the main pixel circuit includes a plurality of thin film transistors, and the plurality of thin film transistors include Low Temperature Poly-Silicon (LTPS).

According to a present embodiment, the auxiliary pixel circuit further includes a storage capacitor that includes a lower electrode and an upper electrode that both overlap the first semiconductor layer, and the storage capacitor is located between the first semiconductor layer and the substrate.

According to a present embodiment, the second gate electrode includes a same material as the lower electrode of the storage capacitor.

According to a present embodiment, the first auxiliary thin film transistor includes a first gate electrode disposed above the first semiconductor layer and that at least partially overlaps the first semiconductor layer.

According to a present embodiment, the display panel further includes a component disposed under the substrate and that corresponds to the sensor area and includes an electronic element that emits or receives light.

According to a present embodiment, the auxiliary pixel circuit further includes an auxiliary connection line that electrically connects the first semiconductor layer to the second semiconductor layer, where the first semiconductor layer and the second semiconductor layer are respectively disposed on different layers.

According to a present embodiment, the first auxiliary thin film transistor further includes a connection electrode electrically connected to a source area or a drain area of the first semiconductor layer, and the auxiliary connection line includes a same material as the connection electrode.

According to a present embodiment, the auxiliary pixel circuit further includes a data line that transmits a data signal to the auxiliary pixel, and the connection electrode comprises a same material as the data line.

According to a present embodiment, the auxiliary pixel circuit includes a first scan line and a second scan line, each transmitting a scan signal to the auxiliary pixel, and the first scan line extends from the second gate electrode and the second scan line extends from the third gate electrode.

According to a present embodiment, the auxiliary pixel circuit includes a previous scan line that transmits a previous scan signal to the fourth auxiliary thin film transistor, and the previous scan line extends from the fourth gate electrode.

According to a present embodiment, the second scan line includes a same material as the previous scan line.

According to a present embodiment, the auxiliary pixel includes a pixel electrode, and the auxiliary pixel circuit includes a next scan line and a seventh auxiliary thin film transistor that turns on and initializes the pixel electrode in response to a next scan signal received through the next scan line, the seventh auxiliary thin film transistor includes a seventh semiconductor layer and a seventh gate electrode that overlaps the seventh semiconductor layer, and the next scan line extends from the seventh gate electrode.

According to a present embodiment, the first scan line includes a same material as the next scan line.

According to one or more embodiments, a display apparatus may include: a substrate including a display area and a sensor area, wherein the display area includes a main pixel and the sensor area includes an auxiliary pixel, wherein the main pixel includes a plurality of thin film transistors, and the plurality of thin film transistors each include Low Temperature Poly-Silicon (LTPS), wherein the auxiliary pixel comprises: a pixel electrode; a first auxiliary thin film transistor that drives the auxiliary pixel; a third auxiliary thin film transistor that diode-connects the first auxiliary thin film transistor; a fourth auxiliary thin film transistor that initializes a voltage of a gate electrode of the first auxiliary thin film transistor; a second auxiliary thin film transistor that transmits a data signal to the first auxiliary thin film transistor; and a seventh auxiliary thin film transistor that that turns on and initializes the pixel electrode, wherein the first auxiliary thin film transistor, third auxiliary thin film transistor and the fourth auxiliary thin film transistor each include a semiconductor layer that includes Low Temperature Poly-Silicon (LTPS) and a gate electrode that overlaps the semiconductor layer, and the second auxiliary thin film transistor and the seventh semiconductor layer each include an oxide semiconductor layer and a gate electrode that overlaps the oxide semiconductor layer.

According to a present embodiment, the display apparatus further includes a component disposed under the sensor area of the substrate and that includes an electronic element that emits or receives light, and a resolution of an image displayed in the sensor area is lower than a resolution of an image displayed by the display area.

DETAILED DESCRIPTION

Figure 1:
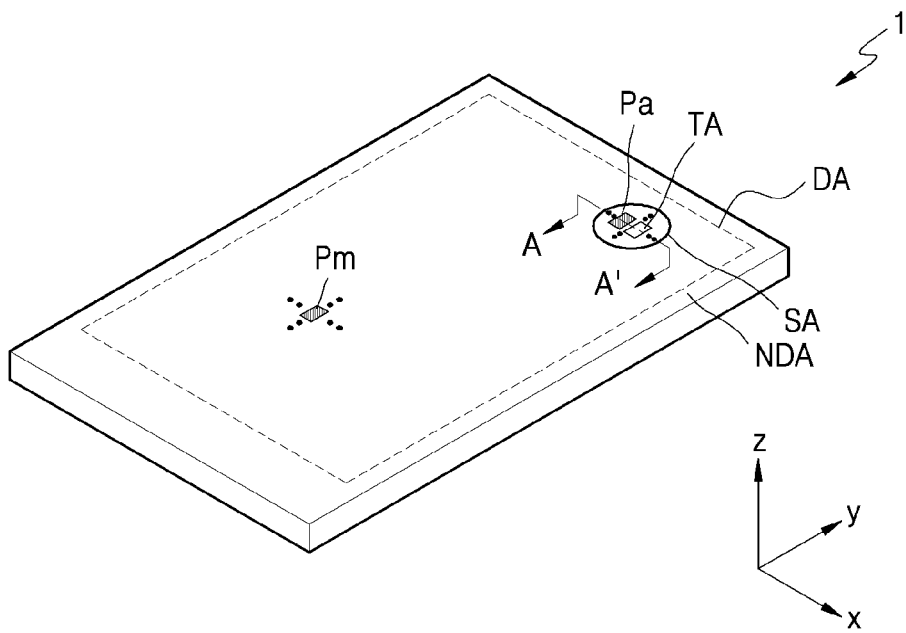
FIG. 1 is a schematic perspective view of a display apparatus according to an embodiment.

As embodiments allow for various changes and numerous embodiments, exemplary embodiments will be illustrated in the drawings and described in detail in the written description. Features of exemplary embodiments and methods of achieving the same may be clearly understood with reference to exemplary embodiments described in detail with the accompanied drawings. Exemplary embodiments may, however, be implemented in many different forms and are not limited to exemplary embodiments set forth herein.

Hereinafter, embodiments will be described in detail with reference to the attached drawings. Like reference numerals in the drawings may denote like elements, and repeated descriptions thereof will be omitted.

When a portion such as a layer, a region, or a component is "on" another layer, region, or component, the portion may be directly on the other portion or intervening portions may be present therebetween.

Size of components in the drawings may be exaggerated for convenience of explanation.

FIG. 1 is a schematic perspective view of a display apparatus 1 according to an embodiment.

Referring to FIG. 1, according to an embodiment, the display apparatus 1 includes a display area DA that displays an image and a non-display area NDA that does not display an image. The display apparatus 1 displays an image by using light emitted from a plurality of main pixels Pm displayed in the display area DA.

According to an embodiment, the display apparatus 1 includes a sensor area SA in the display area DA. As will be described below with reference to FIG. 2, the sensor area SA is an area under which is disposed a component such as a sensor that can detect infrared light, visible light, or sound. The sensor area SA includes a transmission portion TA through which light or/and sound can be output from the component to the external environment, or through which the components can receive light or/and sound propagating in from the external environment. According to an embodiment, when infrared light is received through the sensor area SA, light transmittance may be equal to or greater than about 10%, equal to or greater than about 20%, equal to or greater than about 25%, equal to or greater than 50%, equal to or greater than 85%, or equal to or greater than 90%.

In a present embodiment, a plurality of auxiliary pixels Pa are disposed in the sensor area SA, and an image can be displayed using light emitted from the plurality of auxiliary pixels Pa. The image displayed by the sensor area SA is an auxiliary image and has a lower resolution than an image displayed by the display area DA. That is, as the sensor area SA includes the transmission portion TA through which light or/and sound can be transmitted, the number of auxiliary pixels Pa that can be disposed per unit area in the sensor area SA is less than the number of main pixels Pm that can be disposed per unit area in the display area DA.

According to an embodiment, the sensor area SA is at least partially surrounded by the display area DA, and FIG. 1 shows an embodiment in which the sensor area SA is completely surrounded by the display area DA.

Hereinafter, an organic light-emitting display apparatus according to an embodiment will be described as an example of the display apparatus 1, but embodiments of the display apparatus 1 are not limited thereto. Other embodiments may use various other types of display apparatuses, such as an inorganic light-emitting display or a quantum dot light-emitting display.

In FIG. 1, according to an embodiment, the sensor area SA is arranged at one side, e.g., the upper right side, of a rectangular display area DA, but embodiments are not limited thereto. A shape of the display area DA can be a circle, an oval, or a polygon such as a triangle or a pentagon, and a position of the sensor area SA and the number of sensor areas SA can be variously changed in other embodiments.

Figure 2:
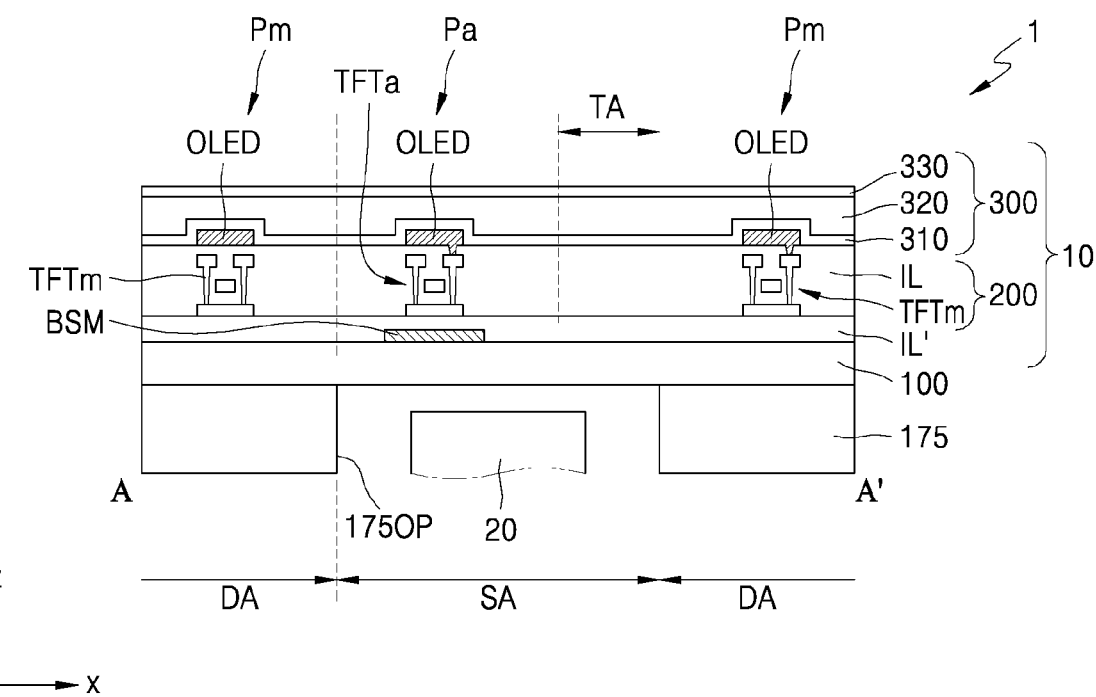
FIG. 2 is a cross-sectional view of a display apparatus according to an embodiment that corresponds to a cross-section of a display apparatus shown in FIG. 1 taken along line A-A' in FIG. 1.

FIG. 2 is a cross-sectional view of the display apparatus 1 according to an embodiment. FIG. 2 corresponds to a cross-section of the display apparatus 1 taken along line A-A' in FIG. 1.

Referring to FIG. 2, according to an embodiment, the display apparatus 1 includes a display panel 10 that includes a display element, and a component 20 located under the display panel 10 and that corresponds to the sensor area SA.

According to an embodiment, the display panel 10 includes a substrate 100, a display element layer 200 disposed on the substrate 100, and a thin film encapsulation layer 300 disposed on the display element layer 200 that seals the display element layer 200. In addition, the display panel 10 further includes a bottom protection film 175 disposed under the substrate 100.

According to an embodiment, the substrate 100 may include glass or a high molecular weight resin. The high molecular weight resin may be polyethersulfone (PES), polyarylate (PAR), polyetherimide (PEI), polyethylene naphthalate (PEN), polyethylene terephthalate (PET), polyphenylene sulfide (PPS), polyacrylate, polyimide (PI), polycarbonate (PC), or cellulose acetate propionate (CAP), etc. A substrate 100 that includes a high molecular weight resin is flexible, rollable, or bendable. The substrate 100 has a multi-layer structure that includes the high molecular weight resin and an inorganic layer.

According to an embodiment, the display element layer 200 includes a circuit layer that includes a thin film transistor, such as a main thin film transistor TFTm and an auxiliary thin film transistor TFTa, an organic light-emitting diode OLED as a display element, and an insulating layer IL located therebetween.

According to an embodiment, a main pixel Pm that includes the main thin film transistor TFTm and an organic light-emitting diode OLED connected to the main thin film transistor TFTm are disposed in the display area DA. An auxiliary pixel Pa that includes the auxiliary thin film transistor TFTa and an organic light-emitting diode OLED connected to the auxiliary thin film transistor TFTa and wirings (not shown) is disposed in the sensor area SA.

In addition, according to an embodiment, the sensor area SA includes a transmission portion TA that lacks the auxiliary thin film transistor TFTa and the display element. The transmission portion TA is an area through which light or sound emitted from a component 20 is transmitted or through which light or sound incident on the component 20 is received.

According to an embodiment, the component 20 is located in the sensor area SA. The component 20 is an electronic element that uses light or sound. For example, the component 20 may be a sensor such as an infrared sensor that detects infrared light, a sensor that outputs and detects light or sound to measure a distance or recognize fingerprints, a small-sized lamp that outputs light, a speaker that outputs sound, etc. An electronic element that uses light can use various wavelength bands, such as visible light, infrared light, or ultraviolet light. A plurality of components 20 can be disposed in the sensor area SA. For example, a light-emitting device and a light-receiving device can be provided together as components 20 in one sensor area SA. Alternatively, a light-emitting portion and a light-receiving portion may be simultaneously provided in one component 20.

In an embodiment, a conductive layer BSM is disposed in the sensor area SA. More particularly, a location of the conductive layer BSM corresponds to the auxiliary pixel Pa in the sensor area SA and also corresponds to a lower portion of the auxiliary thin film transistor TFTa. The conductive layer BSM can prevent light emitted from the component 20 from reaching the auxiliary thin film transistor TFTa of the auxiliary pixel Pa, etc.

According to an embodiment, an insulating layer IL' is disposed on the conductive layer BSM that insulates the auxiliary thin film transistor TFTa from the conductive layer BSM. The insulating layer IL' includes an inorganic insulating material, such as one of silicon oxide, silicon nitride, or silicon oxynitride.

According to an embodiment, a constant voltage or signal is transmitted to the conductive layer BSM to prevent damage to the pixel circuit due to electrostatic discharges. In addition, the conductive layer BSM is electrically connected to wirings that transmit electric power or signals to the auxiliary pixel Pa. Therefore, a constant voltage or a signal is transmitted to the conductive layer BSM.

According to an embodiment, the thin film encapsulation layer 300 includes at least one inorganic encapsulation layer and at least one organic encapsulation layer. In this regard, FIG. 2 shows a first inorganic encapsulation layer 310 and a second inorganic encapsulation layer 330 and an organic encapsulation layer 320 interposed therebetween.

According to an embodiment, the first inorganic encapsulation layer 310 and the second inorganic encapsulation layer 330 each include at least one inorganic insulating material selected from aluminum oxide, titanium oxide, tantalum oxide, hafnium oxide, zinc oxide, silicon oxide, silicon nitride, or silicon oxynitride. The organic encapsulation layer 320 includes a polymeric material. The polymeric material may include polyethylene terephthalate, polyethylene naphthalate, polycarbonate, polyimide, polyethylene sulfonate, polyoxymethylene, polyarylate, hexamethyldisiloxane, an acrylic resin, such as polymethylmethacrylate, polyacrylic acid, etc., or a combination thereof.

According to an embodiment, the bottom protection film 175 is attached under the substrate 100 and supports and protects the substrate 100. The bottom protection film 175 includes an opening 175OP that corresponds to the sensor area SA. The presence of the opening 175OP in the bottom protection film 175 improves the light transmittance of the sensor area SA. The bottom protection film 175 includes PET or PI.

According to an embodiment, an area of the sensor area SA is greater than an area in which the component 20 is arranged. FIG. 2 shows that the area of the sensor area SA is identical to that of the opening 175OP, but embodiments are not limited thereto, and the area of the opening 175OP provided in the bottom protection film 175 need not be identical to the area of the sensor area SA. For example, the area of the opening 175OP can be smaller than the area of the sensor area SA.

In addition, according to an embodiment, an input sensing member that senses a touch input, a reflection prevention member that includes a polarizer and a retarder or a color filter and a black matrix, or a transparent window can be further disposed on the display panel 10.

In a present embodiment, the thin film encapsulation layer 300 is used to seal the display element layer 200, but embodiments are not limited thereto. For example, a sealing substrate attached to the substrate 100 by a sealant or frit can seal the display element layer 200.

Figure 3:
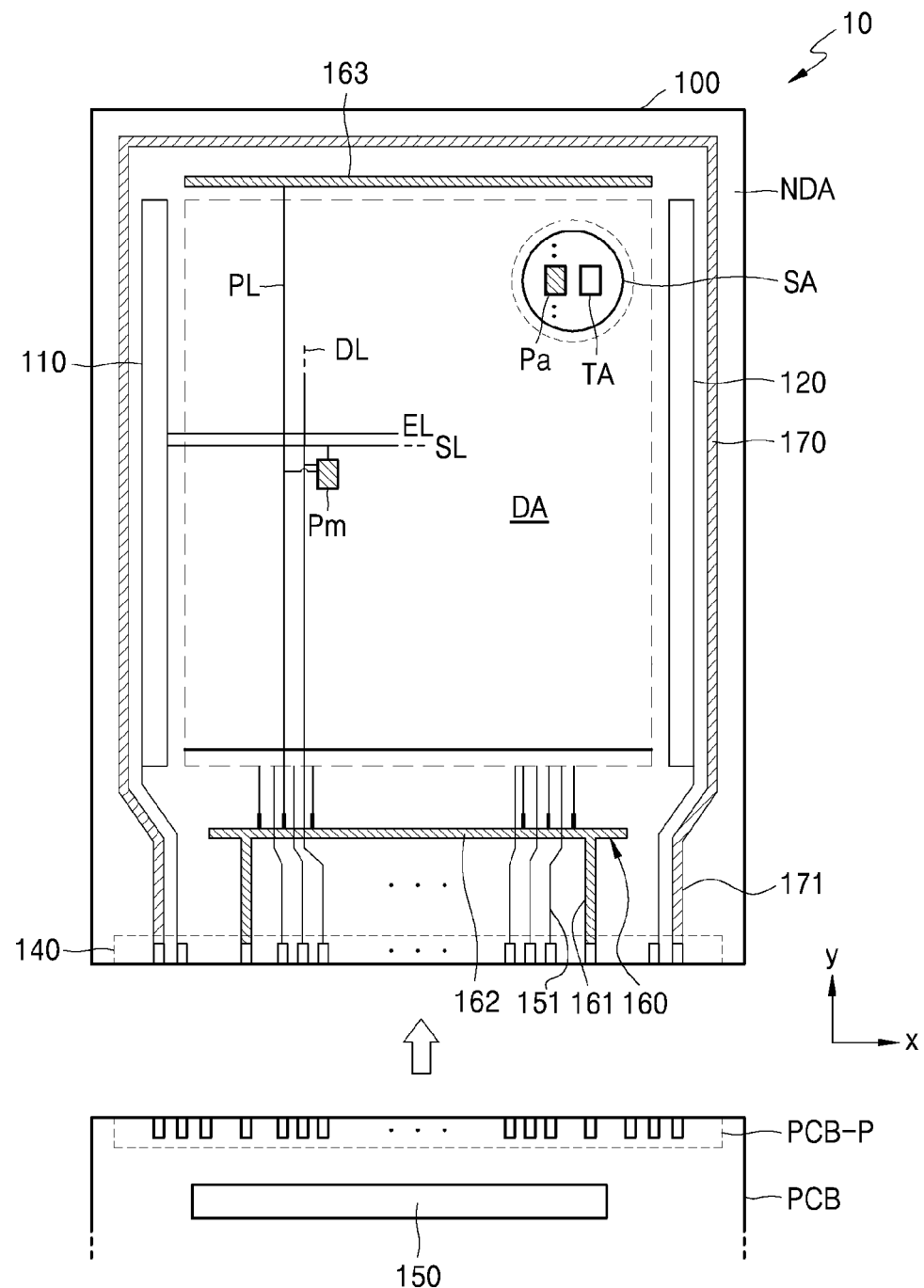
FIG. 3 is a schematic top-plan view of a display panel according to an embodiment.
Figure 4:
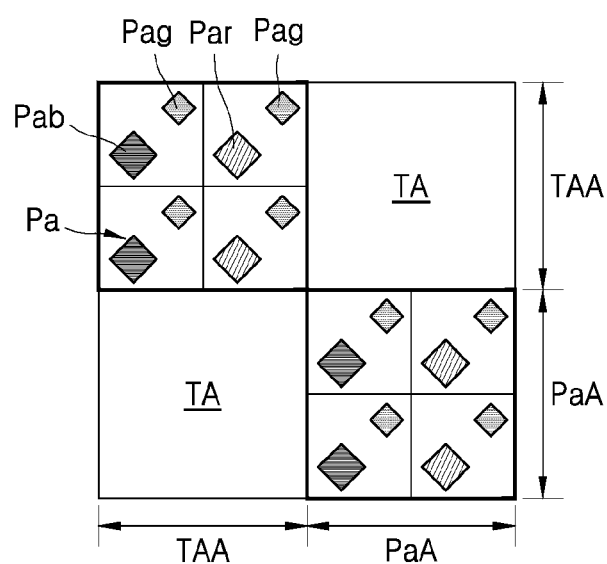
FIG. 4 is an enlarged top-plan view of a sensor area shown in FIG. 3.

FIG. 3 is a schematic top-plan view of the display panel 10 according to an embodiment, and FIG. 4 is an enlarged top-plan view of the sensor area SA of FIG. 3.

Referring to FIG. 3, according to an embodiment, the display panel 10 is disposed in the display area DA and includes the plurality of main pixels Pm. The main pixels Pm each include a display element such as an organic light-emitting diode OLED. Each of the main pixels Pm emits, for example, one of red, green, blue, or white light through the organic light-emitting device OLED. The display area DA is covered by and protected from external air or moisture by the encapsulation member 300 that is described with reference to FIG. 2.

According to an embodiment, the sensor area SA is disposed in the display area DA, and a plurality of auxiliary pixels Pa are disposed in the sensor area SA. The auxiliary pixels Pa each include a display element such as an organic light-emitting diode OLED. Each of the auxiliary pixels Pa emits, for example, one of red, green, blue, or white light through the organic light-emitting diode OLED. In addition, the transmission portion TA is disposed between the auxiliary pixels Pa in the sensor area SA.

According to an embodiment, as the sensor area SA includes the transmission portion TA, a resolution of the sensor area SA is lower than a resolution of the display area DA. For example, the resolution of the sensor area SA is about half that of the display area DA. In some embodiments, the resolution of the display area DA is equal to or greater than about 400 ppi, and the resolution of the sensor area SA is about 200 ppi.

Referring to FIG. 4, according to an embodiment, the sensor area SA includes an auxiliary pixel area PaA that includes at least one auxiliary pixel Pa and a transmission area TAA that includes the transmission portion TA. The auxiliary pixel area PaA and the transmission area TAA are arranged in a lattice.

In an embodiment, the auxiliary pixel area PaA includes a first auxiliary pixel Par that emits red light, a second auxiliary pixel Pag that emits green light, and a third auxiliary pixel Pab that emits blue light. FIG. 4 shows a PenTile type auxiliary pixel Pa, but the auxiliary pixel Pa can also be a stripe type. In addition, even though FIG. 4 shows that eight auxiliary pixels Pa are disposed in the auxiliary pixel area PaA, embodiments are not limited thereto, and the number of auxiliary pixels Pa can be modified according to the resolution of the sensor area SA.

In an embodiment, one main pixel Pm and one auxiliary pixel Pa can include a same pixel circuit. However, embodiments are not limited thereto. The pixel circuit of the main pixel Pm can differ from the pixel circuit of the auxiliary pixel Pa.

According to an embodiment, the main pixel Pm and the auxiliary pixel Pa are each be connected to outer circuits disposed in the non-display area NDA. A first scan driving circuit 110, a second scan driving circuit 120, a terminal 140, a data driving circuit 150, a first power supply line 160, and a second power supply line 170 are disposed in the non-display area NDA.

According to an embodiment, through a scan line SL, the first scan driving circuit 110 transmits a scan signal to each of the main pixel Pm and the auxiliary pixel Pa. Through an emission control line EL, the first scan driving circuit 110 transmits an emission control signal to each of the pixels. The second scan driving circuit 120 is disposed parallel to the first scan driving circuit 110 with the display area DA disposed therebetween. Some of the main pixels Pm and auxiliary pixels Pa that are disposed in the display area DA are electrically connected to the first scan driving circuit 110, and the others are electrically connected to the second scan driving circuit 120. In another embodiment, the second scan driving circuit 120 is omitted.

According to an embodiment, the terminal 140 is disposed at a side of the substrate 100. The terminal 140 is not covered by the insulating layer IL but exposed and electrically connected to a printed circuit board PCB. The first power line 160 is connected to the terminal 140 by a first connection line 161, and the second power line 170 is connected to the terminal 140 by a second connection line 171. A terminal PCB-P of the printed circuit board PCB is electrically connected to the terminal 140 of the display panel 10. The printed circuit board PCB transmits signals or electric power from a controller to the display panel 10. A control signal generated by the controller is transmitted to each of the first scan driving circuit 110 and the second scan driving circuit 120 through the printed circuit board PCB. The controller may transmit, through the first connection line 161 and the second connection line 171, a first power voltage ELVDD and a second power voltage ELVSS (see FIGS. 5 and 6) to the first power supply line 160 and the second power supply line 170, respectively. The first power voltage ELVDD is transmitted to each of the main pixel Pm and the auxiliary pixel Pa through a driving voltage line PL that is connected to the first power supply line 160, and the second power voltage ELVSS is transmitted to opposite electrodes of the main pixel Pm and the auxiliary pixel Pa that are connected to the second power supply line 170.

According to an embodiment, the data driving circuit 150 is electrically connected to a data line DL. A data signal of the data driving circuit 150 is transmitted to each of the main pixel Pm and the auxiliary pixel Pa through a connection wiring 151 connects the terminal 140 to the data line DL. FIG. 3 shows a case in which the data driving circuit 150 is disposed in the printed circuit board PCB. However, in another embodiment, the data driving circuit 150 is disposed on the substrate 100. For example, the data driving circuit 150 can be disposed between the terminal 140 and the first power supply wiring 160.

According to an embodiment, the first power supply wiring 160 includes a first sub-line 162 and a second sub-line 163 that extend parallel to each other in the x-direction with the display area DA disposed therebetween. The second power supply line 170 has the form of a loop with one open side and partially surrounds the display area DA.

Figure 5:
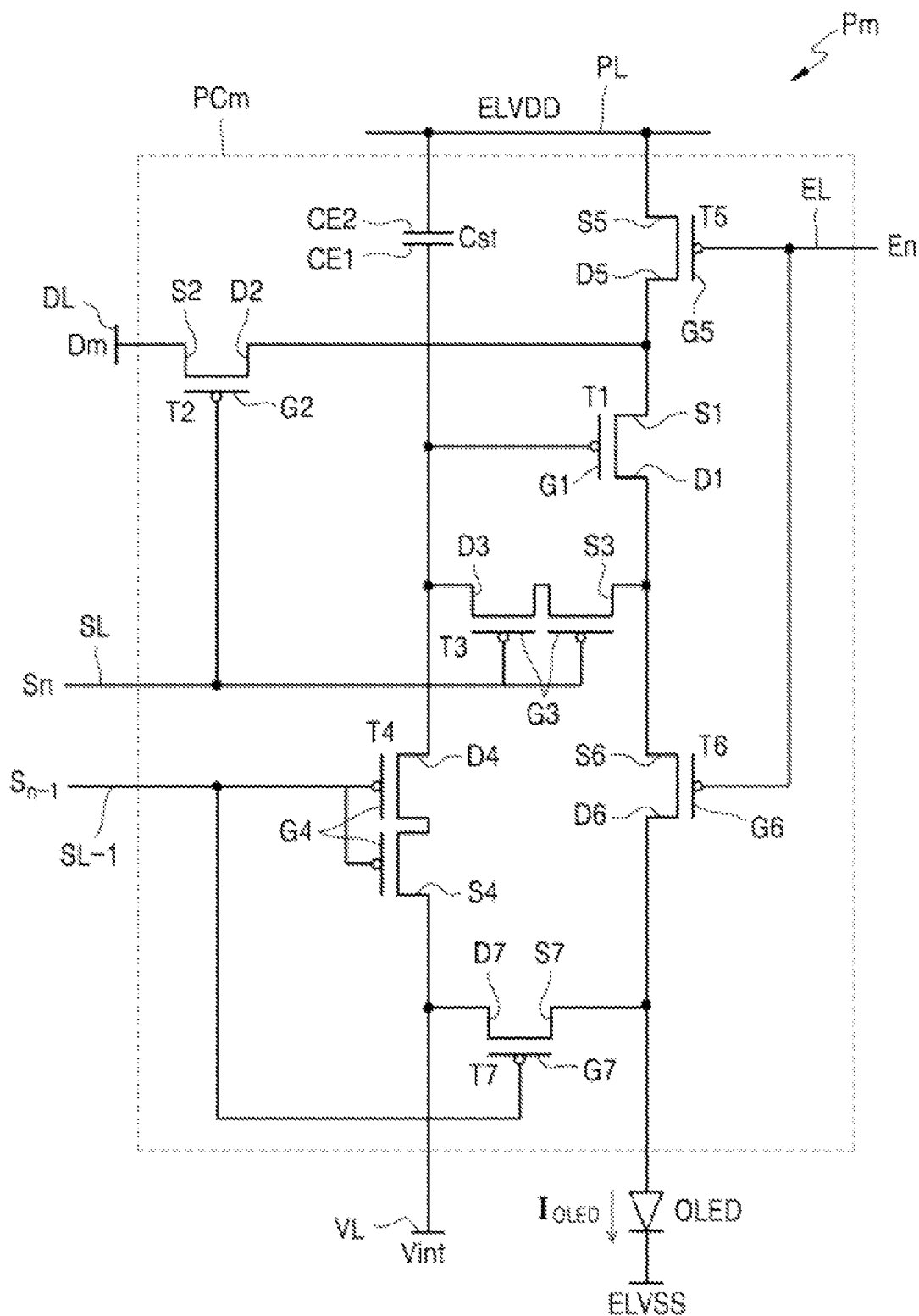
FIG. 5 is an equivalent circuit diagram of a main pixel according to an embodiment.

FIG. 5 is an equivalent circuit diagram of the main pixel Pm according to an embodiment.

Referring to FIG. 5, according to an embodiment, the main pixel Pm includes a main pixel circuit PCm and an organic light-emitting diode OLED connected to the main pixel circuit PCm. The main pixel circuit PCm includes a plurality of thin film transistors and a storage capacitor. The thin film transistors and the storage capacitor are connected to signal lines, such as a scan line SL, a previous signal line SL−1, an emission control line EL, and the data line DL, an initialization voltage line VL, and the driving voltage line PL.

In FIG. 5, according to an embodiment, the main pixel Pm is connected to the signal lines, such as the scan line SL, the previous signal line SL−1, the emission control line EL, and the data line DL, the initialization voltage line VL, and the driving voltage line PL, but embodiments are not limited thereto. In other embodiments, at least one of the signal lines, the initialization voltage line VL, or the driving voltage line PL is shared with neighboring pixels.

According to an embodiment, the plurality of thin film transistors includes a first main thin film transistor T1, a second main thin film transistor T2, a third main thin film transistor T3, a fourth main thin film transistor T4, a fifth main thin film transistor T5, a sixth main thin film transistor T6, and a seventh main thin film transistor T7. The plurality of thin film transistors are respectively referred to as a driving thin film transistor T1, a switching thin film transistor T2, a compensation thin film transistor T3, a first initial thin film transistor T4, an operation control thin film transistor T5, an emission control thin film transistor T6, and a second initial thin film transistor T7, according to their functional characteristics.

According to an embodiment, the signal lines include the scan line SL that transmits a scan signal Sn to the switching thin film transistor T2 and the compensation thin film transistor T3, the previous scan line SL−1 that transmits a previous scan signal Sn−1 to the first initial thin film transistor T4 and the second initial thin film transistor T7, the emission control line EL that transmits an emission control signal En to the operation control thin film transistor T5 and the emission control thin film transistor T6, and the data line DL that intersects with the scan line SL and transmits a data signal Dm. The driving voltage line PL transmits the first power voltage ELVDD to the driving thin film transistor T1, and the initialization voltage line VL transmits an initialization voltage Vint that initializes the driving thin film transistor T1 and the pixel electrode.

According to an embodiment, a driving gate electrode G1 of the driving thin film transistor T1 is connected to a lower electrode CE1 of the storage capacitor Cst; a driving source electrode S1 of the driving thin film transistor T1 is connected to a driving voltage line PL via the operation control thin film transistor T5; and a driving drain electrode D1 of the driving thin film transistor T1 is electrically connected to the pixel electrode of a main organic light-emitting device (OLED) via the emission control thin film transistor T6. The driving thin film transistor T1 receives the data signal Dm in response to a switching operation of the switching thin film transistor T2 and transmits a driving current $I_{OLED}$ to the main organic light-emitting device OLED.

According to an embodiment, a switching gate electrode G2 of the switching thin film transistor T2 is connected to the scan line SL; a switching source electrode S2 of the switching thin film transistor T2 is connected to the data line DL; a switching drain electrode D2 of the switching thin film transistor T2 is connected to the driving source electrode S1 of the driving thin film transistor T1 and is also connected to the driving voltage line PL via the operation control thin film transistor T5. The switching thin film transistor T2 is turned on in response to the scan signal Sn that is received through the scan line SL and performs a switching operation that transmits the data signal Dm received through the data line DL to the driving source electrode S1 of the driving thin film transistor T1.

According to an embodiment, a compensation gate electrode G3 of the compensation thin film transistor T3 is connected to the scan line SL; a compensation source electrode S3 of the compensation thin film transistor T3 is connected to the driving drain electrode D1 of the driving thin film transistor T1 and is also connected to the pixel electrode of the organic light-emitting device OLED; via the emission control thin film transistor T6; and a compensation drain electrode D3 of the compensation thin film transistor T3 is connected to the lower electrode CE1 of the storage capacitor Cst, a first initialization drain electrode D4 of the first initial thin film transistor T4, and the driving gate electrode G1 of the driving thin film transistor T1. The compensation thin film transistor T3 is turned on in response to the scan signal Sn received through the scan line SL and electrically connects the driving gate electrode G1 and the driving drain electrode D1 in the driving thin film transistor T1 to each other, which diode-connects the driving thin film transistor T1.

According to an embodiment, a first initialization gate electrode G4 of the first initial thin film transistor T4 is connected to the previous scan line SL−1; a first initialization source electrode S4 of the first initial thin film transistor T4 is connected to a second initialization drain electrode D7 of the second initial thin film transistor T7 and the initialization voltage line VL; and the first initialization drain electrode D4 of the first initial thin film transistor T4 is connected to the lower electrode CE1 of the storage capacitor Cst, the compensation drain electrode D3 of the compensation thin film transistor T3, and the driving gate electrode G1 of the driving thin film transistor T1. The first initial thin film transistor T4 is turned on in response to the previous scan signal Sn−1 that is received through the previous scan line SL−1 and transmits the initialization voltage Vint to the driving gate electrode G1 of the driving thin film transistor T1, thereby initializing a voltage of the driving gate electrode G1 of the driving thin film transistor T1.

According to an embodiment, an operation control gate electrode G5 of the operation control thin film transistor T5 is connected to the emission control line EL; an operation control source electrode S5 of the operation control thin film transistor T5 is connected to the driving voltage line PL; an operation control drain electrode D5 of the operation control thin film transistor T5 is connected to the driving source electrode S1 of the driving thin film transistor T1 and the switching drain electrode D2 of the switching thin film transistor T2.

According to an embodiment, an emission control gate electrode G6 of the emission control thin film transistor T6 is connected to the emission control line EL; an emission control source electrode S6 of the emission control thin film transistor T6 is connected to the driving drain electrode D1 of the driving thin film transistor T1 and the compensation source electrode S3 of the compensation thin film transistor T3; and an emission control drain electrode D6 of the emission control thin film transistor T6 is electrically connected to the second initialization source electrode S7 of the second initial thin film transistor T7 and the pixel electrode of the organic light-emitting diode OLED.

According to an embodiment, the operation control thin film transistor T5 and the emission control thin film transistor T6 are simultaneously turned on in response to the emission control signal En that is received through the emission control line EL such that the first power voltage ELVDD is transmitted to the main organic light-emitting diode OLED and the driving current $I_{OLED}$ flows to the organic light-emitting diode OLED.

According to an embodiment, a second initialization gate electrode G7 of the second initial thin film transistor T7 is connected to the previous scan line SL−1; a second initialization source electrode S7 of the second initial thin film transistor T7 is connected to the emission control drain electrode D6 of the emission control thin film transistor T6 and the pixel electrode of the main organic light-emitting device OLED; and a second initialization drain electrode D7 of the second initial thin film transistor T7 is connected to the first initialization source electrode S4 of the first initial thin film transistor T4 and the initialization voltage line VL. The second initial thin film transistor T7 is turned on in response to the previous scan signal Sn−1 that is received through the previous scan line SL−1 and initializes the pixel electrode of the main organic light-emitting device OLED.

In FIG. 5, according to an embodiment, the first initial thin film transistor T4 and the second initial thin film transistor T7 are connected to the previous scan line SL−1, but embodiments are not limited thereto. In other embodiments, the first initial thin film transistor T4 is connected to the previous scan line SL−1 and driven in response to the previous scan signal Sn−1, and the second initial thin film transistor T7 is connected to an extra scan line, such as a next scan line, and is driven in response to a signal that is received through the scan line.

According to an embodiment, an upper electrode CE2 of the storage capacitor Cst is connected to the driving voltage line PL, and an opposite electrode of the organic light-emitting device (OLED) is connected to the second power voltage ELVSS, i.e., a common voltage. Therefore, the organic light-emitting device OLED can receive the driving current $I_{OLED}$ from the driving thin film transistor T1 and emit light, thereby displaying an image.

In FIG. 5, according to an embodiment, each of the compensation thin film transistor T3 and the first initial thin film transistor T4 has dual gate electrodes, but embodiments are not limited thereto, and in other embodiments, each of the compensation thin film transistor T3 and the first initial thin film transistor T4 have a single gate electrode.

Figure 6:
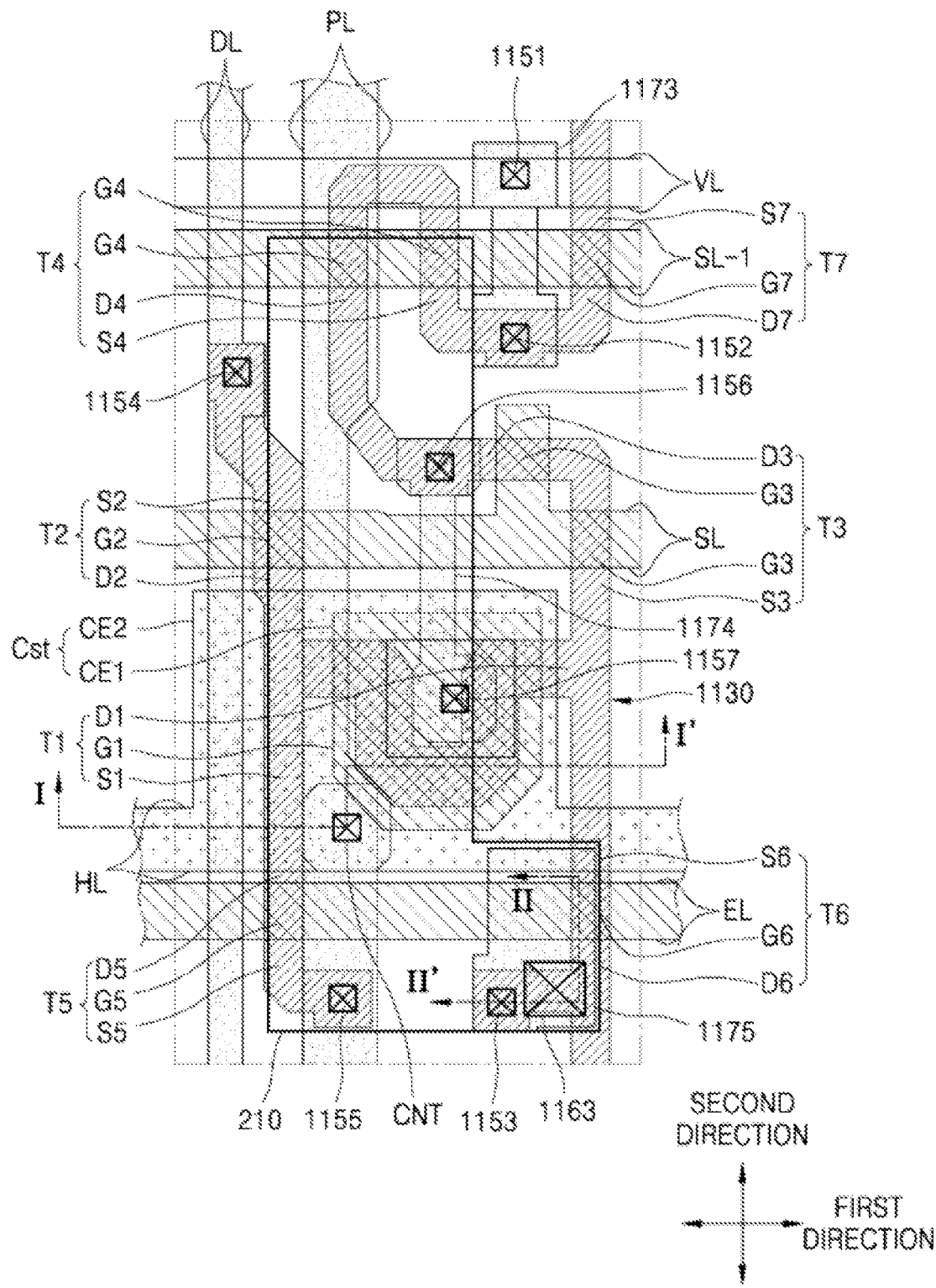
FIG. 6 is a schematic plan view a pixel circuit in a main pixel according to an embodiment.
Figure 7:
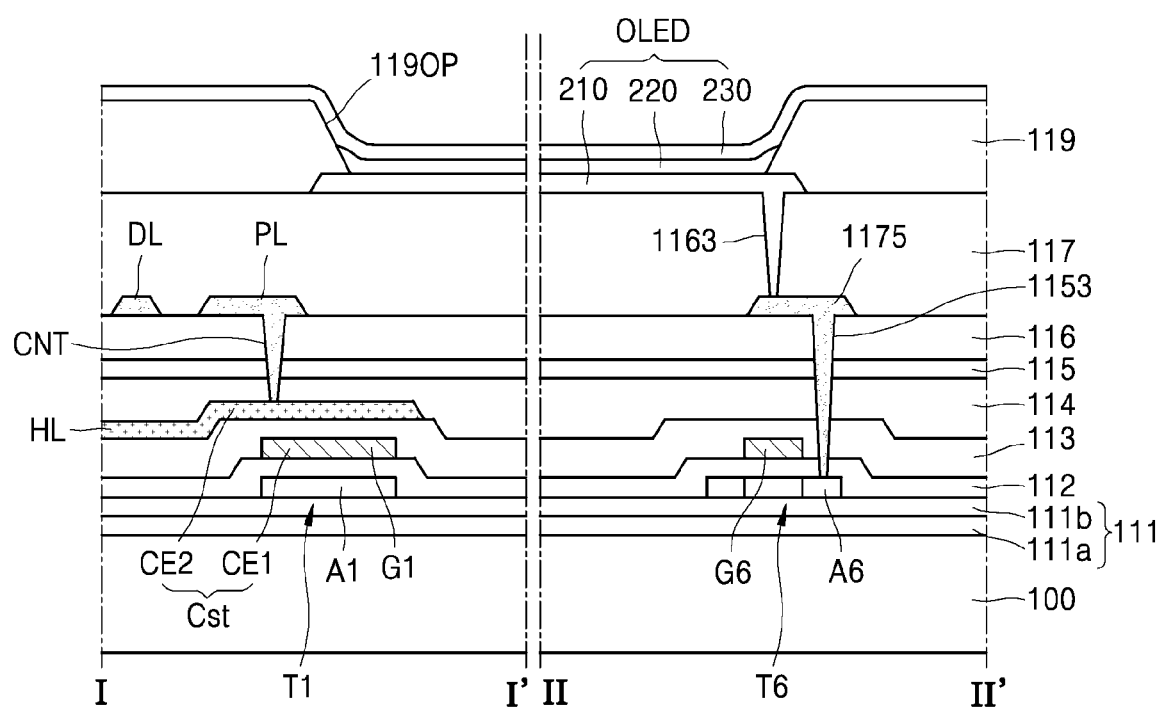
FIG. 7 is a cross-sectional view of the pixel circuit in a main pixel shown in FIG. 6, taken along lines I-I' and II-II' in FIG. 6.

FIG. 6 is a schematic plan view a pixel circuit of a main pixel according to an embodiment, and FIG. 7 shows a cross-section of a pixel circuit of a main pixel taken along lines I-I' and II-II' shown in FIG. 6.

Referring to FIG. 6, according to an embodiment, the driving thin film transistor T1, the switching thin film transistor T2, the compensation thin film transistor T3, the first initial thin film transistor T4, the operation control thin film transistor T5, the emission control thin film transistor T6, and the second initial thin film transistor T7 are disposed on a semiconductor layer 1130.

According to an embodiment, the semiconductor layer 1130 is disposed on a substrate on which a buffer layer that includes an inorganic insulating material is formed. In a present embodiment, the semiconductor layer 1130 includes low temperature poly-silicon (LTPS). A polysilicon material has a high electron mobility, equal to or greater than 100 cm$^2$/Vs, low energy consumption, and high reliability, and is thus used as a semiconductor layer of a thin film transistor in a display apparatus. However, embodiments are not limited thereto. In other embodiments, the semiconductor layer 1130 includes amorphous silicon (a-Si) or an oxide semiconductor, and some of the semiconductor layers in the plurality of thin film transistors include LTPS, and other semiconductor layers include a-Si or an oxide semiconductor.

According to an embodiment, portions of the semiconductor layer 1130 respectively correspond to the semiconductor layers in the driving thin film transistor T1, the switching thin film transistor T2, the compensation thin film transistor T3, the first initial thin film transistor T4, the operation control thin film transistor T5, the emission control thin film transistor T6, and the second initial thin film transistor T7. In other words, the semiconductor layers in the driving thin film transistor T1, the switching thin film transistor T2, the compensation thin film transistor T3, the first initial thin film transistor T4, the operation control thin film transistor T5, the emission control thin film transistor T6, and the second initial thin film transistor T7 are connected to each other and bent in various shapes.

According to an embodiment, the semiconductor layer 1130 includes a channel area, a source area, and a drain area at each side of the channel area, wherein the source area and the drain area correspond to a source electrode and a drain electrode of a relevant thin film transistor. Hereinafter, for convenience of description, a source area and a drain area are respectively referred to as a source electrode and a drain electrode.

According to an embodiment, the driving thin film transistor T1 includes the driving gate electrode G1 that overlaps a driving channel area and the driving source electrode S1 and the driving drain electrode D1 at each side of the driving channel area. The driving channel area has a long channel length in a relatively narrow area by being bent into an omega shape. Increasing the length of the driving channel area increases a driving range of a gate voltage. Therefore, a gradation of light emitted from the organic light-emitting diode OLED can be more precisely controlled and the display quality can be improved.

According to an embodiment, the switching thin film transistor T2 includes the switching gate electrode G2 that overlaps a switching channel area and the switching source electrode S2 and the switching drain electrode D2 at each side of the switching channel area. The switching drain electrode D2 is connected to the driving source electrode S1.

According to an embodiment, the compensation thin film transistor T3, which is a dual thin film transistor, includes the compensation gate electrodes G3 that respectively overlap two compensation channel areas, and also includes the compensation source electrode S3 and the compensation drain electrode D3 arranged at each side of the two compensation channel areas. The compensation thin film transistor T3 is connected to the driving gate electrode G1 of the driving thin film transistor T1 through a node connection line 1174 to be described below.

According to an embodiment, the first initial thin film transistor T4, which is a dual thin film transistor, includes the first initialization gate electrodes T4 that overlap two first initialization channel areas, and also includes the first initialization source electrode S4 and the first initialization drain electrode D4 respectively arranged at each side of the first initialization channel areas.

According to an embodiment, the operation control thin film transistor T5 includes the operation control gate electrodes G5 that overlap an operation control channel area and the operation control source electrode S4 and the operation control drain electrode D5 arranged at each side of the operation control channel area. The operation control drain electrode D5 is connected to the driving source electrode S1.

According to an embodiment, the emission control thin film transistor T6 includes the emission control gate electrode G6 that overlaps an emission control channel area and the emission control source electrode S6 and the emission control drain electrode D6 arranged at each side of the emission control channel area. The emission control source electrode S6 is connected to the driving drain electrode D1.

According to an embodiment, the second initial thin film transistor T7 includes the second initialization gate electrode G7 that overlaps a second initialization channel area and the second initialization source electrode S7 and the second initialization drain electrode D7 arranged at each side of the second initialization channel area.

According to an embodiment, the thin film transistors are connected to the signal lines, such as the scan line SL, the previous scan line SL−1, the emission control line EL, and the data line DL, the initialization voltage line VL, and the driving voltage line PL.

According to an embodiment, on the semiconductor layer 1130, the scan line SL, the previous scan line SL−1, the emission control line EL, and the driving gate electrode G1 are disposed with insulating layer(s) interposed therebetween.

According to an embodiment, the scan line SL extends in a first direction. Portions of the scan line SL respectively correspond to the switching gate electrode G2 and the compensation gate electrode G3. For example, portions of the scan line SL that overlap the channel areas of the switching thin film transistor T2 and the compensation transistor T3 are the switching gate electrode G2 and the compensation gate electrode G3, respectively.

According to an embodiment, the previous scan line SL−1 extends in a first direction and portions of the previous scan line SL−1 respectively correspond to the first initialization gate electrode G4 and the second initialization gate electrode G7. For example, portions of the previous scan line SL−1 that overlap the channel areas of the first initial thin film transistor T4 and the second thin film transistor T7 are the first initialization gate electrode G4 and the second initialization gate electrode G7, respectively.

According to an embodiment, the emission control line EL extends in the first direction. Portions of the emission control line EL respectively correspond to the operation control gate electrode G5 and the emission control gate electrode G6. For example, portions of the emission control line EL that overlap the channel areas of the operation control thin film transistor T5 and the emission control thin film transistor T6 are the operation control gate electrode G5 and the emission control gate electrode G6, respectively.

According to an embodiment, the driving gate electrode G1 is a floating electrode and is connected to the compensation thin film transistor T3 via the node connection line 1174.

According to an embodiment, an electrode voltage line HL is disposed on the scan line SL, the previous scan line SL−1, the emission control line EL, and the driving gate electrode G1, with insulating layer(s) interposed therebetween.

According to an embodiment, the electrode voltage line HL extends in the first direction to intersect with the data line DL and the driving voltage line PL, which extend in a second direction that crosses the first direction. A portion of the electrode voltage line HL covers at least a portion of the driving gate electrode G1 and forms the storage capacitor Cst together with the driving gate electrode G1. For example, the driving gate electrode G1 is the lower electrode CE1 of the storage capacitor Cst and a portion of the electrode voltage line HL is the upper electrode CE2 of the storage capacitor Cst.

According to an embodiment, the upper electrode CE2 of the storage capacitor Cst is electrically connected to the driving voltage line PL. In this regard, the electrode voltage line HL is in contact with the driving voltage line PL disposed on the electrode voltage line HL via a contact hole CNT. Accordingly, a constant voltage level of the electrode voltage line HL is equal to a voltage level of the driving voltage line PL. For example, the electrode voltage line HL has a constant voltage of about +5 V. The electrode voltage line HL is a lateral driving voltage line.

According to an embodiment, the driving voltage line PL extends in the second direction, and the electrode voltage line HL that is electrically connected to the driving voltage line PL extends in the first direction that intersects with the second direction. Therefore, a plurality of driving voltage lines PL and a plurality of electrode voltage lines HL form a mesh structure in the display area DA.

According to an embodiment, the data line DL, the driving voltage line PL, an initialization connection line 1173, and the node connection line 1174 are disposed on the electrode voltage line HL, with insulating layer(s) interposed therebetween.

According to an embodiment, the data line DL extends in the second direction and is in contact with the switching source electrode S2 of the switching thin film transistor T2 via a contact hole 1154. A portion of the data line DL functions as the switching source electrode.

According to an embodiment, the driving voltage line PL is in contact with the electrode voltage line HL via the contact hole CNT, as described above. In addition, the driving voltage line PL is connected to the operation control thin film transistor T5 via a contact hole 1155. The driving voltage line PL is in contact with the operation control drain electrode D5 via the contact hole 1155.

According to an embodiment, one end of the initialization connection line 1173 is connected to the first initial thin film transistor T4 and the second initial thin film transistor T7 via a contact hole 1152, and the other end of the initialization connection line 1173 is connected to the initialization voltage line VL, which will be described below, via contact hole 1151.

According to an embodiment, one end of the node connection line 1174 is connected to the compensation drain electrode D3 via a contact hole 1156, and the other end of the node connection line 1174 is in contact with the driving gate electrode G1 via a contact hole 1157.

According to an embodiment, the initialization voltage line VL is disposed on the data line DL, the driving voltage line PL, and the initialization connection line 1173, with insulating layer(s) interposed therebetween.

According to an embodiment, the initialization voltage line VL extends in the first direction. The initialization voltage line VL is connected to the first initial thin film transistor T4 and the second initial thin film transistor T7 through the initialization connection line 1173. The initialization voltage line VL has a constant voltage, such as −2 V, etc.

According to an embodiment, the initialization voltage line VL is disposed on a same layer and includes a same material as the pixel electrode 210 of the organic light-emitting diode OLED, shown in FIG. 7. The pixel electrode 210 is connected to the emission control thin film transistor T6. The pixel electrode 210 is in contact with a contact metal 1175 via a contact hole 1163, and the contact metal 1175 is in contact with the emission control drain electrode D6 via the contact hole 1153.

In FIG. 6, according to an embodiment, the initialization voltage line VL is disposed on a same layer as that of the pixel electrode 210. However, embodiments are not limited thereto, and in other embodiments, the initialization voltage line VL is disposed on a same layer as the electrode voltage line HL.

Hereinafter, referring to FIG. 7, a stack structure of elements included in the display panel according to an embodiment is described.

According to an embodiment, the substrate 100 includes glass or a high molecular weight resin. The high molecular weight resin may be one of polyethersulfone (PES), polyarylate (PAR), polyetherimide (PEI), polyethylene naphthalate (PEN), polyethylene terephthalate (PET), polyphenylene sulfide (PPS), polyacrylate, polyimide (PI), polycarbonate (PC), or cellulose acetate propionate (CAP), etc. The substrate 100 that includes the high molecular weight resin is flexible, rollable, or bendable. The substrate 100 may have a multi-layer structure that includes the high molecular weight resin and an inorganic layer.

According to an embodiment, a buffer layer 111, is located on the substrate 100 and reduces or prevents permeation of foreign material, humidity, or external air from a lower portion of the substrate 100 and provides a planar surface on the substrate 100. The buffer layer 111 includes an inorganic material such as an oxide or a nitride, an organic material, or an organic-inorganic complex material, and may include a single layer or multiple layers of an inorganic material and an organic material. A barrier layer that prevents permeation of external air is further interposed between the substrate 100 and the buffer layer 111. In an embodiment, the buffer layer 111 includes a first buffer layer 111a and a second buffer layer 111b that are stacked together.

According to an embodiment, the gate electrodes G1 and G6, i.e., the driving gate electrode G1 and the emission control gate electrode G6, are disposed on semiconductor layers A1 and A6 respectively, with a first gate insulating layer 112 interposed therebetween. The gate electrodes G1 and G6 include one or more of molybdenum (Mo), aluminum (Al), copper (Cu), or titanium (Ti), etc., and may include a single layer or multiple layers. For example, the gate electrodes G1 and G6 each include a single layer of Mo. The scan line SL, the previous scan line SL−1, and the emission control line EL are formed on a same layer as the gate electrodes G1 and G6. In other words, the gate electrodes G1 and G6, the scan line SL, the previous scan line SL−1, and the emission control line EL are disposed on the first gate insulating layer 112.

According to an embodiment, the first gate insulating layer 112 includes one of silicon dioxide ($SiO_2$), silicon nitride ($SiN_x$), silicon oxynitride (SiON), aluminum oxide ($Al_2O_3$), titanium dioxide ($TiO_2$), tantalum oxide ($Ta_2O$), hafnium oxide ($HfO_2$), or zinc oxide ($ZnO_2$), etc.

According to an embodiment, a second gate insulating layer 113 is disposed that covers the gate electrodes G1 and G6. The second gate insulating layer 113 includes one of $SiO_2$, $SiN_x$, SiON, $Al_2O_3$, $TiO_2$, $Ta_2O_5$, $HfO_2$, or $ZnO_2$, etc.

According to an embodiment, the lower electrode CE1 of the storage capacitor Cst is integrally formed with the driving gate electrode G1 of the driving thin film transistor T1. That is, the driving gate electrode G1 of the driving thin film transistor T1 functions as the lower electrode CE1 of the storage capacitor Cst.

According to an embodiment, the upper electrode CE2 of the storage capacitor Cst overlaps the lower electrode CE1, with the second gate insulating layer 113 therebetween. In this case, the second gate insulating layer 113 functions as a dielectric layer of the storage capacitor Cst. The upper electrode CE2 includes a conductive material such as Mo, Al, Cu, or Ti, etc., and may include multiple layers or a single layer that includes the above-mentioned materials. For example, the upper electrode CE2 may include a single layer of Mo or multiple layers of Mo/Al/Mo.

In FIG. 7, according to an embodiment, the storage capacitor Cst overlaps the driving thin film transistor T1, but embodiments are not limited thereto. In other embodiments, the arrangement of the storage capacitor Cst can be variously changed. For example, in an alternative embodiment, the storage capacitor Cst does not overlap the driving thin film transistor T1.

According to an embodiment, the upper electrode CE2 functions as the electrode voltage line HL. For example, a portion of the electrode voltage line HL is the upper electrode CE2 of the storage capacitor Cst.

According to an embodiment, a first interlayer insulating layer 114 is provided that covers the upper electrode CE2, and a second interlayer insulating layer 115 and a third interlayer insulating layer 116 are disposed on the first interlayer insulating layer 114. The first through third interlayer insulating layers 114 through 116 include $SiO_2$, $SiN_x$, SiON, $Al_2O_3$, $TiO_2$, $Ta_2O_5$, $HfO_2$, or $ZnO_2$, etc.

According to an embodiment, the data line DL, the driving voltage line PL, and the contact metal 1175 are disposed on the third interlayer insulating layer 116. The data line DL, the driving voltage line PL, and the contact metal 1175 include a conductive material, such as Mo, Al, Cu, or Tl, and may be a multilayer or a single-layer structure that includes one or more of the above-mentioned materials. For example, the data line DL, the driving voltage line PL, and the contact metal 1175 each have a multi-layer structure that includes Ti/Al/Ti.

According to an embodiment, the upper electrode CE2 of the storage capacitor Cst is in contact with the driving voltage line PL via the contact hole CNT that penetrates the first through the third interlayer insulating layers 114 through 116. The electrode voltage line HL is in contact with the driving voltage line PL via the contact hole CNT. Accordingly, a voltage level of the electrode voltage line HL, which is a constant voltage, is equal to a voltage level of the driving voltage line PL.

According to an embodiment, the contact metal 1175 is in contact with the semiconductor layer A6 of the emission control thin film transistor T6 via a contact hole 1153 that penetrates the third interlayer insulating layer 116, the second interlayer insulating layer 115, the first interlayer insulating layer 114, the second gate insulating layer 113, and the first gate insulating layer 112. The emission control thin film transistor T6 is electrically connected to the pixel electrode 210 of the organic light-emitting diode OLED through the contact metal 1175.

According to an embodiment, a planarization layer 117 is disposed on the data line DL, the driving voltage line PL, and the contact metal 1175, and the organic light-emitting diode OLED is disposed on the planarization layer 117.

According to an embodiment, the planarization layer 117 has a planarized upper surface that planarizes a shape of the pixel electrode 210. The planarization layer 117 may include a single layer or multiple layers that includes a film formed of an organic material. The planarization layer 117 includes a general commercial polymer such as benzocyclobutene (BCB), polyimide, hexamethyldisiloxane (HMDSO), polymethylmethacrylate (PMMA), or polystyrene (PS), a general commercial polymer that has a phenolic group, an acrylic polymer, an imide polymer, an arylether polymer, an amide polymer, a flourinated polymer, a p-xylene polymer, a vinyl alcohol polymer, or a blend thereof. The planarization layer 117 includes an inorganic material. The planarization layer 117 includes one or more of $SiO_2$, $SiN_x$, SiON, $Al_2O_3$, $TiO_2$, $Ta_2O_5$, $HfO_2$, or $ZnO_2$, etc. When the planarization layer 117 includes an inorganic material, a chemical planarization polishing operation may be performed as needed. In addition, the planarization layer 117 may include both an organic material and an inorganic material.

According to an embodiment, the pixel electrode 210 may be a (semi) transmissive electrode or a reflective electrode. In some embodiments, the pixel electrode 210 includes a reflective film that includes one or more of silver (Ag), magnesium (Mg), Al, platinum (Pt), palladium (Pd), gold (Au), nickel (Ni), neodymium (Nd), iridium (Ir), chromium (Cr), or a combination thereof, and may also include a transparent or translucent electrode layer that is formed on the reflecting film. The transparent or translucent electrode layer includes at least one of indium tin oxide (ITO), indium zinc oxide (IZO), zinc oxide (ZnO), indium oxide ($In_2O_3$), indium gallium oxide (IGO), or aluminum zinc oxide (AZO). In some embodiments, the pixel electrode 210 includes a stack structure that includes ITO/Ag/ITO.

According to an embodiment, a pixel defining layer 119 is disposed on the planarization layer 117. The pixel defining layer 119 forms an emission area of a pixel by having an opening 119 OP that exposes a center portion of the pixel electrode 210. In addition, the pixel defining layer 119 prevents arcs, etc., occurring at edges of the pixel electrode 210 by increasing a distance between the edge of the pixel electrode 210 and an opposite electrode 230 above the pixel electrode 210. The pixel defining layer 119 includes an organic insulating material such as polyimide, polyamide, an acryl resin, BCB, HMDSO, or a phenolic resin, and can be formed by a spin coating method, etc.

According to an embodiment, an intermediate layer 220 of the organic light-emitting diode OLED includes an organic emission layer. The organic emission layer includes an organic material that includes one of a fluorescent material or a phosphorescent material, each emitting red, green, blue, or white light. The organic emission layer may include a low molecular weight material or a high molecular weight material, and functional layers, such as a hole transport layer (HLT), a hole injection layer (HIL), an electron transport layer (ETL), and an electron injection layer (EIL), may be alternatively further arranged under or above the organic emission layer. The intermediate layer 220 corresponds to each of the plurality of pixel electrodes 210. However, embodiments of the intermediate layer 220 are not limited thereto. In other embodiments, the intermediate layer 220 can be variously modified, for example, to include a layer that is integrally formed across the plurality of pixel electrodes 210.

According to embodiments, the opposite electrode 230 may be a light-transmissive electrode or a reflective electrode. In some embodiments, the opposite electrode 230 includes a transparent or translucent electrode and includes a metal thin film that includes one or more of lithium (Li), calcium (Ca), lithium fluoride (LiF)/Ca, LiF/Al, Al, Ag, Mg, or a combination thereof and has a small work function. A transparent conductive oxide (TCO) layer that includes ITO, IZO, ZnO, or $In_2O_3$, etc., is further disposed on the metal thin film. The opposite electrode 230 is disposed over the display area DA and the peripheral area PA and on the intermediate layer 220 and the pixel defining layer 119. The opposite electrode 230 is formed as a single body with a plurality of organic light-emitting diodes OLED that correspond to the plurality of pixel electrodes 210.

According to some embodiments, when the pixel electrode 210 is a reflective electrode and the opposite electrode 230 is a transmissive electrode, light emitted from the intermediate layer 220 is emitted toward the opposite electrode 230, and thus, the display apparatus is a top emission type. According to other embodiments, when the pixel electrode 210 is a transparent or translucent electrode and the opposite electrode 230 is a reflective electrode, light emitted from the intermediate layer 220 is emitted toward the substrate 100, and thus, the display apparatus is a bottom emission type. However, embodiments are not limited thereto. According to still other embodiments, the display apparatus is a dual emission type that emits light in two directions toward the top and bottom.

Figure 8:
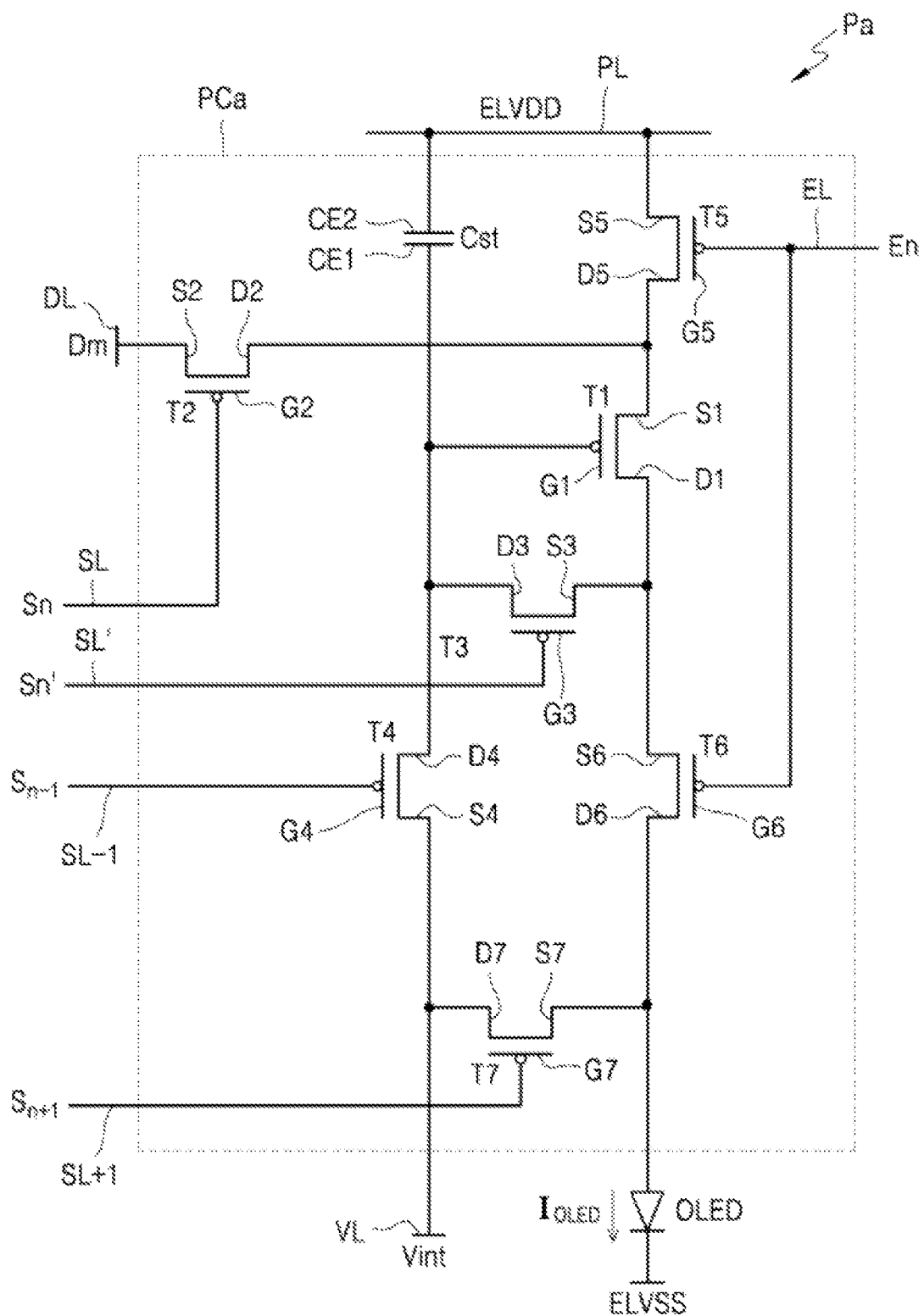
FIG. 8 is an equivalent circuit diagram of an auxiliary pixel according to an embodiment.

FIG. 8 is an equivalent circuit diagram of the auxiliary pixel Pa according to an embodiment.

According to an embodiment, the equivalent circuit diagram of the auxiliary pixel Pa shown in FIG. 8 has a circuit structure similar to that of the main pixel Pm shown in FIG. 5, but is different from the main pixel Pm of FIG. 5 in respect of the structure of some thin film transistors. Hereinafter, differences between FIGS. 8 and 5 will be mainly described.

Referring to FIG. 8, according to an embodiment, the auxiliary pixel Pa includes an auxiliary pixel circuit PCa and an organic light-emitting diode OLED that is connected to the auxiliary pixel circuit PCa. The auxiliary pixel circuit PCa includes a plurality of thin film transistors and a storage capacitor. The plurality of thin film transistors and the storage capacitor are connected to scan lines, such as a first scan line SL, a second scan line SL', the previous scan line SL−1, the next scan line SL+1, the emission control line EL, and the data line DL, the initialization voltage line VL, and the driving voltage line PL.

Compared to the main pixel circuit PCm shown in FIG. 5, the auxiliary pixel circuit PCa according to an embodiment includes additional signal lines, such as the second scan line SL' and the next scan line SL+1.

According to an embodiment, the plurality of thin film transistors include a first auxiliary thin film transistor T1, a second auxiliary thin film transistor T2, a third auxiliary thin film transistor T3, a fourth auxiliary thin film transistor T4, a fifth auxiliary thin film transistor T5, a sixth auxiliary thin film transistor T6, and the seventh auxiliary thin film transistors T7. The plurality of thin film transistors are respectively referred to as the driving thin film transistor T1, the switching thin film transistor T2, the compensation thin film transistor T3, the first initial thin film transistor T4, the operation control thin film transistor T5, the emission control thin film transistor T6, and the second initial thin film transistor T7, according to their functional characteristics.

According to an embodiment, the scan lines includes a first scan line SL that transmits a first scan signal Sn, a second scan line SL' that transmits a second scan signal Sn', a previous scan line SL−1 that transmits a previous scan signal Sn−1 to the initial thin film transistor T4, an emission control line EL that transmits an emission control signal En to the operation control thin film transistor T5 and the emission control thin film transistor T6, a next scan line SL+1 that transmits a next scan signal Sn+1 to the second initial thin film transistor T7, and a data line DL that intersects with the first scan line SL and transmits a data signal Dm thereto.

According to an embodiment, the driving voltage line PL transmits a driving voltage ELVDD to the driving thin film transistor T1, and the initialization voltage line VL transmits an initializing voltage Vint that initializes the driving thin film transistor T1 and the pixel electrode.

According to an embodiment, a driving gate electrode G1 of the driving thin film transistor T1 is connected to a lower electrode CE1 of the storage capacitor Cst, a driving source electrode S1 of the driving thin film transistor T1 is connected to a lower driving voltage line PL via the operation control thin film transistor T5, and the driving drain electrode D1 of the driving thin film transistor T1 is electrically connected to the pixel electrode of a main organic light-emitting device (OLED) via the emission control thin film transistor T6. The driving thin film transistor T1 receives the data signal Dm in response to a switching operation of the switching thin film transistor T2 and transmits a driving current $I_{OLED}$ to the main organic light-emitting device (OLED).

According to an embodiment, a switching gate electrode G2 of the switching thin film transistor T2 is connected to the first scan line SL, a switching source electrode S2 of the switching thin film transistor T2 is connected to the data line DL, a switching drain electrode D2 of the switching thin film transistor T2 is connected to the driving source electrode S1 of the thin film transistor T1 and is also connected to a lower driving voltage line PL via the operation control thin film transistor T5. The switching thin film transistor T2 is turned on in response to the first scan signal Sn that is received through the first scan signal SL and performs a switching operation that transmits the data signal Dm received through the data line DL to the driving source electrode S1 of the driving thin film transistor T1.

According to an embodiment, a compensation gate electrode G3 of the compensation thin film transistor T3 is connected to the second scan line SL', a compensation source electrode S3 of the compensation thin film transistor T3 is connected to the driving drain electrode D1 of the driving thin film transistor T1 and is also connected to the pixel electrode 210 of the organic light-emitting device OLED, and a compensation drain electrode D3 of the compensation thin film transistor T3 is connected to the lower electrode CE1 of the storage capacitor Cst, a first initialization drain electrode D4 of the first initial thin film transistor T4, and the driving gate electrode G1 of the driving thin film transistor T1. The compensation thin film transistor T3 is turned on in response to the second scan signal Sn' received through the second scan signal SL', electrically connects the driving gate electrode G1 and the driving drain electrode D1 of the driving thin film transistor T1, which diode-connects the driving thin film transistor T1.

According to an embodiment, a first initialization gate electrode G4 of the first initial thin film transistor T4 is connected to the previous scan line SL−1, the first initialization source electrode S4 of the first initial thin film transistor T4 is connected to the second initialization drain electrode D7 of the second initial thin film transistor T7 and the initialization voltage line VL, and the first initialization drain electrode D4 of the first initial thin film transistor T4 is connected to the lower electrode CE1 of the storage capacitor Cst, the compensation drain electrode D3 of the compensation thin film transistor T3, and the driving gate electrode G1 of the driving thin film transistor T1. The first initial thin film transistor T4 is turned on in response to the previous scan signal Sn−1 that is received through the previous scan line SL−1, and transmits the initialization voltage Vint to the driving gate electrode T1 of the driving thin film transistor, thereby initializing a voltage of the driving gate electrode G1 of the driving thin film transistor T1.

According to an embodiment, an operation control gate electrode G5 of the operation control thin film transistor T5 is connected to the emission control line EL, an operation control source electrode S5 of the operation control thin film transistor T5 is connected to the lower driving line voltage PL, an operation control drain electrode D5 of the operation control thin film transistor T5 is connected to the driving source electrode S1 of the driving thin film transistor T1 and the switching drain electrode D2 of the switching thin film transistor T2.

According to an embodiment, an emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to the second initialization source electrode S7 of the second initial thin film transistor t7 and the pixel electrode of the organic light-emitting diode OLED.

According to an embodiment, the operation control thin film transistor T5 and the emission control thin film transistor T6 are simultaneously turned on in response to the emission control signal En received through the emission control line EL so that the driving voltage ELVDD is transmitted to the main organic light-emitting device (OLED) and the driving current $I_{OLED}$ flows to the organic light-emitting device OLED.

According to an embodiment, a second initialization gate electrode G7 of the second initial thin film transistor T7 is connected to the next scan line SL+1, a second initialization source electrode 87 of the second initial thin film transistor T7 is connected to the emission control drain electrode D6 of the emission control thin film transistor T6 and the pixel electrode of the main organic light-emitting diode (OLED), and a second initialization drain electrode D7 of the second initial thin film transistor T7 is connected to the first initialization source electrode S4 of the first initial thin film transistor T4 and the initialization voltage line VL. The second initial thin film transistor T7 is turned on in response to the next scan signal Sn+1 received through the next scan line SL+1 and initializes the pixel electrode of the main organic light-emitting device (OLED).

FIG. 8 shows an embodiment in which the first initial thin film transistor T4 is connected to the previous scan line SL−1 and the second initial thin film transistor T7 is connected to the next scan line SL+1, but embodiments are not limited thereto. In other embodiments, the second initial thin film transistor T7 is connected to the emission control line EL and driven in response to the emission control signal En.

In addition, according to an embodiment, the source electrodes S1 through S7 and the drain electrodes D1 through D4 shown in FIGS. 5 and 8 can be changed according to whether each of the transistors is p-type or n-type.

Particular operations of the auxiliary pixel Pa according to an embodiment are as follows:

During an initialization period, according to an embodiment, when the previous scan signal Sn−1 is transmitted through the previous scan line SL−1, the first initial thin film transistor T4 is turned on in response to the previous scan signal Sn−1, and the driving thin film transistor T1 is initialized by an initialization voltage Vint received from the initialization voltage line VL.

During a data programming period, according to an embodiment, when the first scan signal Sn and the second scan signal Sn' are respectively received through the first scan line SL and the second scan line SL', the switching thin film transistor T2 and the compensation thin film transistor T3 are turned on in response to the first scan signal Sn and the second scan signal Sn'. Here, the driving thin film transistor T1 is diode-connected and biased in a forward direction by the turned-on compensation thin film transistor T3.

By doing so, according to an embodiment, a compensation voltage Dm+Vth, where Vth is a negative value, which is less than the data signal Dm received from the data line DL by a threshold voltage Vth of the driving thin film transistor T1, is transmitted to the driving gate electrode G1 of the driving thin film transistor T1.

According to an embodiment, the driving voltage ELVDD and the compensation voltage Dm+Vth are transmitted to both ends of the storage capacitor Cst, and an electric charge that corresponds to a voltage difference between the two ends of the storage capacitor Cst is stored in the storage capacitor Cst.

During an emission period, according to an embodiment, the operation control thin film transistor T5 and the emission control thin film transistor T6 are turned on in response to the emission control signal En received from the emission control line EL. A driving current $I_{OLED}$ that corresponds to a voltage difference between the driving voltage ELVDD and a voltage of the driving gate electrode G1 of the driving thin film transistor T1 is generated, and the driving current $I_{OLED}$ is transmitted to the organic light-emitting device OLED via the emission control thin film transistor T6.

In a present embodiment, at least one of the thin film transistors T1, T2, T3, T4, T5, T6, and T7 in the auxiliary pixel Pa includes a semiconductor layer that includes an oxide, and other thin film transistors include semiconductor layers that include silicon. For example, the driving thin film transistor T1, the compensation thin film transistor T3, and the first initial thin film transistor T4 include an oxide semiconductor, and the switching thin film transistor T2, the operation control thin film transistor T5, the emission control thin film transistor T6, and the second initial thin film transistor T7 include a LTPS semiconductor. In another embodiment, at least one of the switching thin film transistor T2, the operation control thin film transistor T5, the emission control thin film transistor T6, and the second initial thin film transistor T7 includes an oxide semiconductor.

A display apparatus according to a present embodiment includes a component 20, such as an infrared optical sensor, under the sensor area SA of the display panel 10. In this case, image quality abnormalities occur in the auxiliary pixel Pa in the sensor area SA due to infrared light emitted from the component.

Therefore, in the display panel 10 according to a present embodiment, some of the plurality of thin film transistors T1, T2, T3, T4, T5, T6, and T7 in the auxiliary pixel Pa are oxide semiconductors to address image quality abnormalities that may occur in the auxiliary pixel Pa in the sensor area SA due to the infrared light emitted from the component 20.

An oxide semiconductor has a wide band gap (about 3.1 eV), a high carrier mobility, and a low leakage current, and therefore, even during a long driving period, there is little voltage drop. In addition, changes in luminance due to a voltage drop are not great during low-frequency driving. Accordingly, as the driving thin film transistor T1, the compensation thin film transistor T3, and the first initial thin film transistor T4, which are most affected by infrared radiation, respectively include an oxide semiconductor, luminance variations of the main pixel Pa due to infrared radiation can be reduced.

Figure 9:
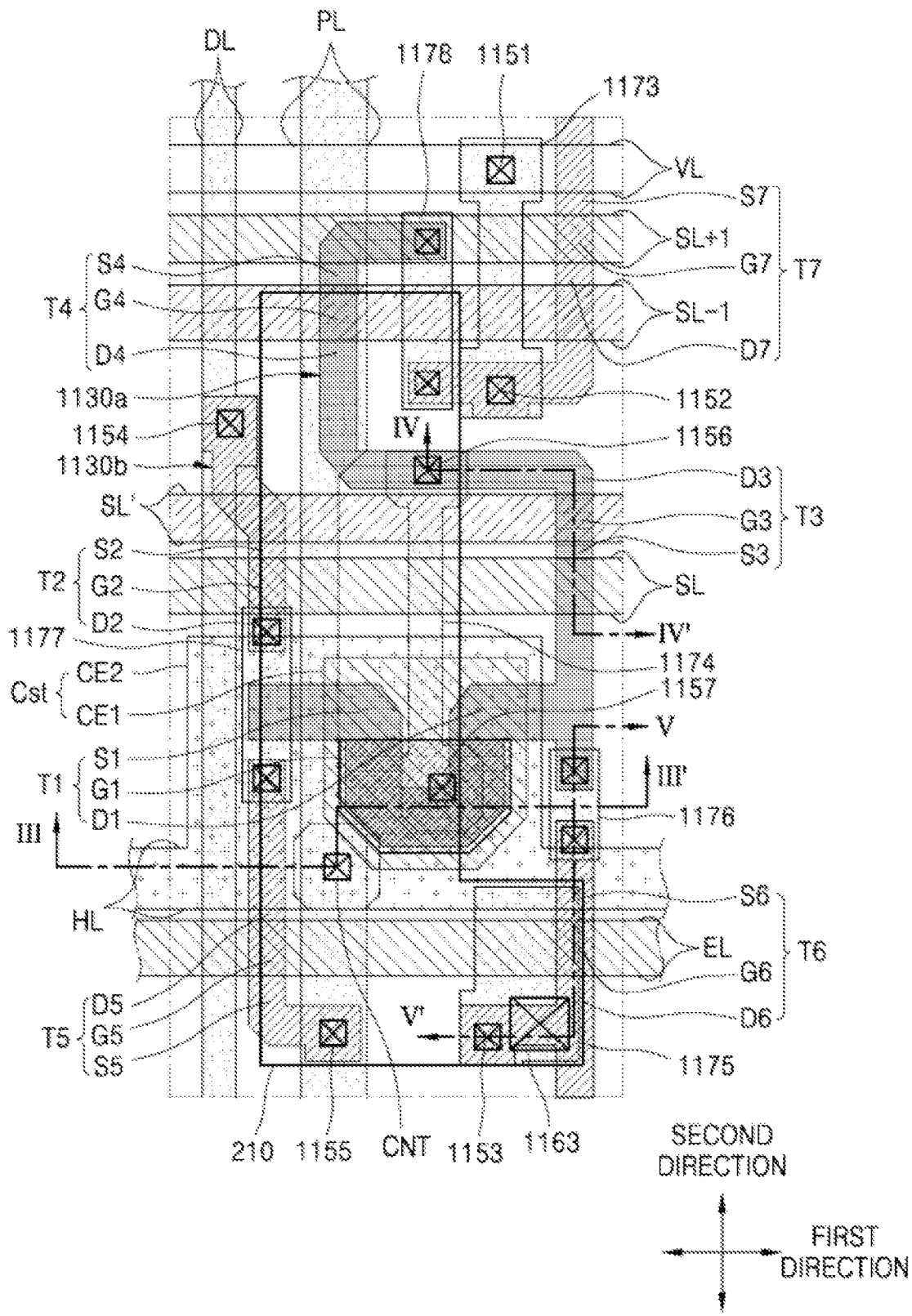
FIG. 9 is a schematic plan view of a pixel circuit in an auxiliary pixel according to an embodiment.
Figure 10:
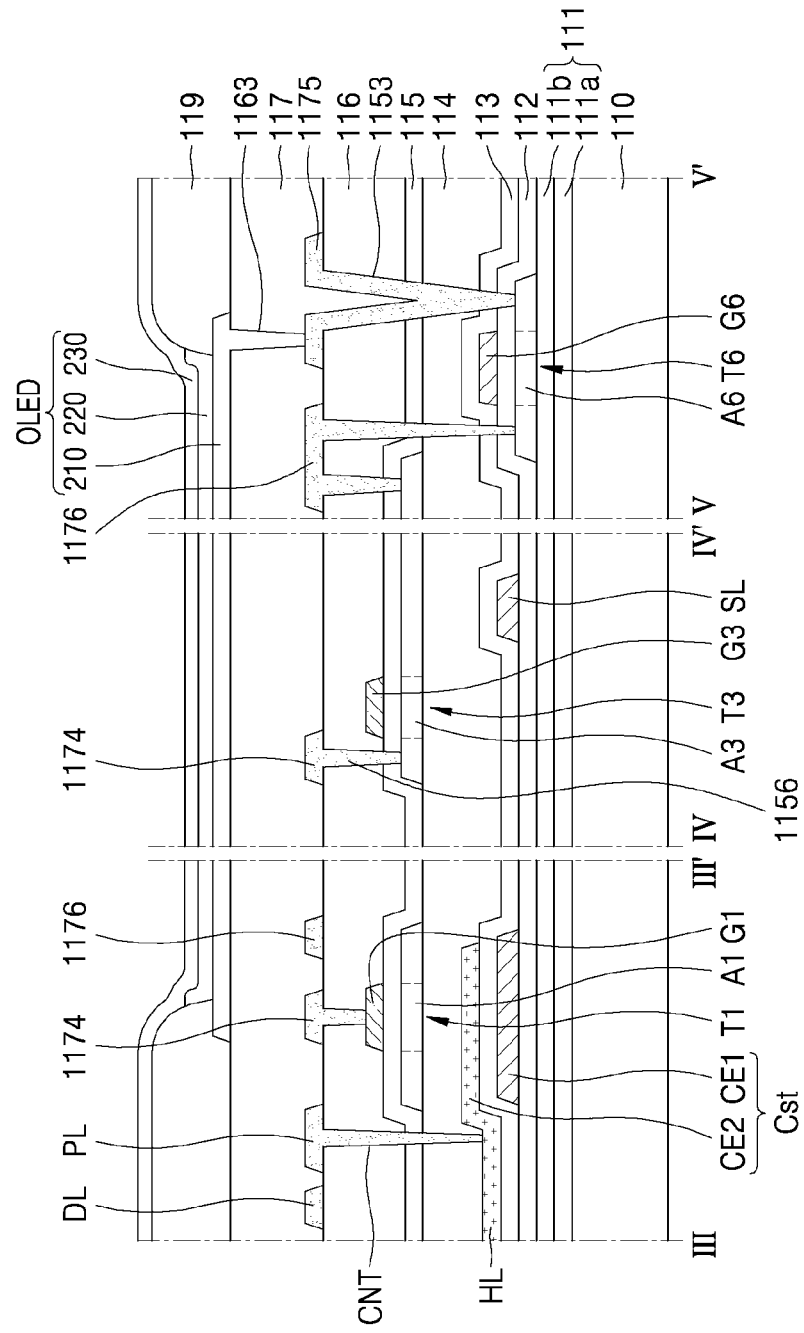
FIG. 10 is a cross-sectional view of the pixel circuit in an auxiliary pixel shown in FIG. 9, taken along lines III-III', IV-IV', and V-V' in FIG. 9.

FIG. 9 is a schematic plan view of a pixel circuit of an auxiliary pixel according to an embodiment, and FIG. 10 shows a cross-section of a pixel circuit of an auxiliary pixel shown in FIG. 9, taken along lines III-III', IV-IV', and V-V'.

Referring to FIG. 9, the auxiliary pixel Pa according to an embodiment includes the first scan line SL, the second scan line SL', the previous scan line SL−1, the next scan line SL+1, the emission line EL, and the initialization voltage line VL that extend in the first direction, and the data line DL and the driving voltage line PL that extend in the second direction to intersect therewith.

According to an embodiment, the auxiliary pixel Pa includes the driving thin film transistor T1, the switching thin film transistor T2, the compensation thin film transistor T3, the first initial thin film transistor T4, the operation control thin film transistor T5, the emission control thin film transistor T6, the second initial thin film transistor T7, and the storage capacitor Cst.

In a present embodiment, each of the driving thin film transistor T1, the compensation thin film transistor T3, and the first initial thin film transistor T4 in the auxiliary pixel Pa includes an oxide semiconductor.

In the auxiliary pixel Pa, according to an embodiment, the switching thin film transistor T2, the operation control thin film transistor T5, the emission control thin film transistor T6, and the second initial thin film transistor T7 include a silicon semiconductor.

According to an embodiment, the oxide semiconductor layers 1130a of the driving thin film transistor T1, the compensation thin film transistor T3, and the first initial thin film transistor T4 are connected to each other and bent in various shapes. The oxide semiconductor layer 1130a may include various metal oxides, such as indium-gallium-zinc-oxide (IGZO).

According to an embodiment, the silicon semiconductor layers 1130b of the switching thin film transistor T2, the operation control thin film transistor T5, the emission control thin film transistor T6, and the second initial thin film transistor T7 are disposed on a same layer and include a same material. For example, the silicon semiconductor layer 1130b includes LTPS.

According to an embodiment, the driving thin film transistor T1 includes the driving gate electrode G1 that overlaps a driving channel area A1 and the driving source electrode S1 and the driving drain electrode D1 at each side of the driving channel area. The driving channel area that overlaps the driving gate electrode G1 has a long channel length in a narrow area by being bent into an omega shape. Increasing the length of the driving channel area increases a driving range of a gate voltage. Therefore, gradation of light emitted from the organic light-emitting diode OLED can be more precisely controlled and the display quality can be improved. The driving gate electrode G1 is disposed above an island-type driving semiconductor layer A1, and is electrically connected to the compensation drain area D3 of the compensation thin film transistor T3 by the node connection line 1174.

According to an embodiment, the storage capacitor Cst overlaps the driving thin film transistor T1. The storage capacitor Cst includes a lower electrode CE1 and an upper electrode CE2. The storage capacitor Cst is disposed under a driving semiconductor layer A1.

According to an embodiment, the switching thin film transistor T2 includes the switching gate electrode G2 that overlaps a switching channel area and the switching source electrode S2 and the switching drain electrode D2 at each side of the switching channel area. The switching drain electrode D2 is connected to the driving source electrode S1.

According to an embodiment, the compensation thin film transistor T3 include the compensation gate electrode G3 that overlaps a compensation channel area A3, and includes the compensation source electrode S3 and the compensation drain electrode D3 at each side of the compensation gate electrode G3. The compensation thin film transistor T3 is connected to the driving gate electrode G1 of the driving thin film transistor T1 through the node connection line 1174 to be described below. In another embodiment, the compensation thin film transistor T3 has a dual gate electrode, as shown in FIG. 6.

According to an embodiment, the first initial thin film transistor T4 includes the first initialization gate electrode G4 that overlaps a first initialization channel area, and further includes the first initialization source electrode S4 and the first initialization drain electrode D4 at each side of the first initialization gate electrode G4. In another embodiment, the first initial thin film transistor T4 has a dual gate electrode, as shown in FIG. 6.

According to an embodiment, the operation control thin film transistor T5 includes the operation control gate electrode G5 that overlaps an operation control channel area and further includes the operation control source electrode G5 and the operation control drain electrode D5 at each side of the operation control channel area. The operation control drain electrode D5 is connected to the driving source electrode S1.

According to an embodiment, the emission control thin film transistor T6 includes the emission control gate electrode G6 that overlaps an emission control channel area A6, and further includes the emission control source electrode S6 and the emission control drain electrode D6 at each side of the emission control gate electrode G6. The emission control source electrode S6 is connected to the driving drain electrode D1.

According to an embodiment, the second initial thin film transistor T7 includes the second initialization gate electrode G7 that overlaps a second initialization channel area, and further includes the second initialization source electrode S7 and the second initialization drain electrode D7 at each sides of the second initialization gate electrode G7.

According to an embodiment, the thin film transistors are connected to the signal lines, such as the first scan line SL, second scan line SL', the previous scan line SL−1, the next scan line SL+1, the emission control line EL, and the data line DL, the initialization voltage line VL, and the driving voltage line PL.

Referring to FIGS. 9 and 10, according to an embodiment, the silicon semiconductor layer 1130b described above is disposed on the buffer layer 111 on the substrate 100. In addition, the conductive layer BSM shown in FIG. 2 is disposed on the first buffer layer 111a and the second buffer layer 111b.

According to an embodiment, the first scan line SL, the next scan line SL+1, the emission control line EL, and the lower electrode CE1 are disposed above the silicon semiconductor layer 1130b, with the first gate insulating layer 112 interposed therebetween. The first scan line SL, the next scan line SL+1, the emission control line EL, and the lower electrode CE1 are disposed on a same layer and include a same material.

According to an embodiment, the first scan line SL extends in the first direction, and a portion of the first scan line SL corresponds to the switching gate electrode G2. For example, a portion of the first scan line SL that overlaps the channel area of the switching thin film transistor T2 is the switching gate electrode G2.

The next scan line SL+1 extends in the first direction, and a portion of the next scan line SL+1 corresponds to the second initialization gate electrode G7. For example, a portion of the next scan line SL+1 that overlaps the channel area of the second initial thin film transistor T7 is the second initialization gate electrode G7.

According to an embodiment, the emission control line EL extends in the first direction, and portions of the emission control line EL correspond to the operation control gate electrode G5 and the emission control gate electrode G6, respectively. For example, portions of the emission control line EL that overlap the channel areas of the operation control thin film transistor T5 and the emission control thin film transistor T6 are the operation control gate electrode G5 and the emission control gate electrode G6, respectively.

According to an embodiment, the electrode voltage line HL is disposed on the first scan line SL, the next scan line SL+1, the emission control line EL, and the lower electrode CE1 with the second gate insulating layer 113 interposed therebetween.

According to an embodiment, the electrode voltage line HL extends in the first direction and intersects the data line DL and the driving voltage line PL. A portion of the electrode voltage line HL covers at least a portion of the lower electrode CE1 to form the storage capacitor Cst.

According to an embodiment, the upper electrode CE2 of the storage capacitor Cst is electrically connected to the driving voltage line PL. In this regard, the electrode voltage line HL is in contact with the driving voltage line PL that is on the electrode voltage line HL via a contact hole CNT. Accordingly, a voltage level of the electrode voltage line HL, which is a constant voltage, is equal to a voltage level of the driving voltage line PL. For example, the electrode voltage line HL has a constant voltage of about +5 V. The electrode voltage line HL is a lateral driving voltage line.

According to an embodiment, the driving voltage line PL extends in the second direction, and the electrode voltage line HL extends in the first direction that intersects the second direction. Therefore, in the display area DA, a plurality of driving voltage lines PL and a plurality of electrode voltage lines HL form a mesh structure.

According to an embodiment, the oxide semiconductor layer 1130a is disposed above the electrode voltage line HL, with the first interlayer insulating layer 114 interposed therebetween. As described above, portions of the oxide semiconductor layer 1130a form the driving thin film transistor T1, the compensation thin film transistor T3, and the first initial thin film transistor T4.

According to an embodiment, the second scan line SL', the previous scan line SL−1, and the driving gate electrode G1 are disposed on the oxide semiconductor layer 1130a, with the second interlayer insulating layer 115 interposed therebetween. Referring to FIG. 10, the second interlayer insulating layer 115 functions as a gate insulating layer that insulates the driving semiconductor layer A1 from the driving gate electrode G1 and insulates the compensation semiconductor layer A3 from the compensation gate electrode G3.

According to an embodiment, the second scan line SL extends in the first direction, and a portion of the second scan line SL' corresponds to the compensation gate electrode G3. For example, a portion of the second scan line SL' overlaps the compensation thin film transistor T3 is the compensation gate electrode G3.

According to an embodiment, the previous scan line SL−1 extends in the first direction, and a portion of the previous scan line SL−1 corresponds to the first initialization gate electrode G4. For example, a portion of the previous scan line SL−1 that overlaps the channel area of the first initial thin film transistor T4 is the first initialization gate electrode G4.

As shown in FIG. 10, according to an embodiment, the driving gate electrode G1 is disposed above the driving semiconductor layer A1. The driving gate electrode G1 is a floating electrode and is electrically connected to the compensation drain electrode D3 of the compensation thin film transistor T3 by the node connection line 1174.

According to an embodiment, the data line DL, the driving voltage line PL, the initialization connection line 1173, the node connection line 1174, and auxiliary connection lines 1176, 1177, and 1178 are disposed on the driving gate electrode G1, with the third interlayer insulating layer 116 interposed therebetween.

According to an embodiment, the data line DL extends in the second direction and is in contact with the switching source electrode S2 of the switching thin film transistor T2 via a contact hole 1154. A portion of the data line DL functions as the switching source electrode S2.

According to an embodiment, the driving voltage line PL extends in the second direction and is in contact with the electrode voltage line HL via the contact hole CNT, as described above. In addition, the driving voltage line PL is connected to the operation control thin film transistor T5 via a contact hole 1155. A portion of the driving voltage line PL functions as the operation control drain electrode D5.

According to an embodiment, one end of the initialization connection line 1173 is connected to the second initial thin film transistor T7 via the contact hole 1152, and the other end of the initialization connection line 1173 is connected to the initialization voltage line VL to be described below, via a contact hole 1151.

According to an embodiment, an end of the node connection line 1174 is connected to the compensation drain electrode D3 via a contact hole 1156, and another end of the node connection line 1174 is in contact with the driving gate electrode G1 via a contact hole 1157.

According to an embodiment, the auxiliary connection lines 1176, 1177, and 1178 connect the oxide semiconductor layer 1130a and the silicon semiconductor layer 1130b to each other, wherein the oxide semiconductor layer 1130a and the silicon semiconductor layer 1130b are disposed on different layers. The auxiliary connection line 1176 connects the thin film transistor T1 and the emission control thin film transistor T6, the auxiliary connection line 1177 connects the driving thin film transistor T1, the switching thin film transistor T2, and the operation control thin film transistor T5 to each other, and the auxiliary connection line 1178 connects the first initial thin film transistor T4 and the second initial thin film transistor T7.

According to an embodiment, the initialization voltage line VL is disposed on the data line DL, the driving voltage line PL, the initialization connection line 1173, the node connection line 1174, and the auxiliary connection lines 1176, 1177, and 1178, with the insulating layer(s) interposed therebetween. The initialization voltage line VL is disposed on the planarization layer 117.

According to an embodiment, the initialization voltage line VL extends in the first direction. Through the initialization connection line 1173, the initialization voltage line VL is in contact with the first initial thin film transistor T4 and the second initial thin film transistor T7 that are connected to each other by the auxiliary connection line 1178. The initialization voltage line VL has a constant voltage, such as −2 V.

According to an embodiment, the initialization voltage line VL is disposed on the same layer and includes the same material as the pixel electrode 210 of the organic light-emitting diode OLED, shown in FIG. 10. The pixel electrode 210 is connected to the emission control thin film transistor T6. The pixel electrode 210 is in contact with a contact metal 1175 via a contact hole 1163, and the contact metal 1175 is in contact with the emission control drain electrode D6 via the contact hole 1153.

An embodiment is described in which the initialization voltage line VL is disposed on a same layer as the pixel electrode 210, but in another embodiment, the initialization voltage line VL is disposed on a same layer as that of the electrode voltage line HL.

In addition, according to an embodiment, the stack structure described above with reference to FIG. 10 is identical to the stack structure of FIG. 7, and therefore, the descriptions with reference to FIG. 7 will be referred to for the detailed description of the layers, and repeated descriptions will be omitted.

The display apparatus 1 according to a present embodiment includes a component 20, such as an infrared optical sensor, under the sensor area SA of the display panel 10. In this case, image quality abnormalities can occur in the auxiliary pixel Pa in the sensor area SA due to infrared light emitted from the component 20.

According to an embodiment, some of the plurality of transistors T1, T2, T3, T4, T5, T6, and T7 in the auxiliary pixel circuit PCa of the auxiliary pixel Pa are oxide semiconductors and the others are silicon semiconductors, according to the functions of the thin film transistors, thereby resolving image quality abnormalities that can occur in the auxiliary pixel Pa in the sensor area SA due to infrared light emitted from the component 20.

Therefore, the display apparatus 1 according to a present embodiment can minimize luminance changes of the auxiliary pixel Pa due to infrared radiation by including oxide semiconductors in the driving thin film transistor T1, the compensation thin film transistor T3, and the first initial thin film transistor T4, the characteristics of which are most affected by the infrared radiation.

According to an above-described embodiment, a display panel with an enlarged display area that can display an image in a sensor area and a display apparatus that includes the display panel can be implemented. However, the scope of embodiments is not limited to the effects.

It will be understood that exemplary embodiments described herein are to be considered in a descriptive sense only and not for purpose of limitation, and it will be understood by those of ordinary skill in the art that various changes in forms and details may be made from exemplary embodiments. Therefore, the scope of exemplary embodiments will be defined according to technical idea of the following claims.

What is claimed is:

1. A display panel comprising:
    a substrate that includes a display area and a sensor area,
    wherein the display area includes a main pixel and the sensor area includes an auxiliary pixel and a transmission portion that lacks the auxiliary pixel, wherein a resolution of an image displayed in the sensor area is lower than a resolution of an image displayed in the display area,
    wherein the main pixel is electrically connected to a main pixel circuit and the auxiliary pixel is electrically connected to an auxiliary pixel circuit,
    wherein the auxiliary pixel circuit includes
        a first auxiliary thin film transistor that includes a first semiconductor layer that includes an oxide semiconductor material and a first gate electrode that overlaps the first semiconductor layer, and
        a second auxiliary thin film transistor that includes a second semiconductor layer that includes Low Temperature Poly-Silicon (LTPS) and a second gate electrode that overlaps the second semiconductor layer.

2. The display panel of claim 1, wherein
the first auxiliary thin film transistor drives the auxiliary pixel, and
the second auxiliary thin film transistor includes a switching thin film transistor that transmits a data signal to the first auxiliary thin film transistor.

3. The display panel of claim 1, wherein
the auxiliary pixel circuit further includes a third auxiliary thin film transistor that diode-connects the first auxiliary thin film transistor, and
the third auxiliary thin film transistor includes a third semiconductor layer that includes an oxide semiconductor material and a third gate electrode that overlaps the third semiconductor layer.

4. The display panel of claim 3, wherein
the auxiliary pixel circuit includes a fourth auxiliary thin film transistor that initializes a voltage of the first gate electrode of the first auxiliary thin film transistor, and
the fourth auxiliary thin film transistor includes a fourth semiconductor layer that includes an oxide semiconductor material and a fourth gate electrode that overlaps the fourth semiconductor layer.

5. The display panel of claim 4, wherein the first semiconductor layer, the third semiconductor layer, and the fourth semiconductor layer are integrally arranged on a same layer.

6. The display panel of claim 1, wherein
the main pixel circuit includes a plurality of thin film transistors, and
the plurality of thin film transistors each include Low Temperature Poly-Silicon (LTPS).

7. The display panel of claim 1, wherein
the auxiliary pixel circuit further includes a storage capacitor that includes a lower electrode and an upper electrode that both overlap the first semiconductor layer, and
the storage capacitor is located between the first semiconductor layer and the substrate.

8. The display panel of claim 7, wherein the second gate electrode includes a same material as the lower electrode of the storage capacitor.

9. The display panel of claim 1, wherein the first auxiliary thin film transistor includes a first gate electrode disposed above the first semiconductor layer and that at least partially overlaps the first semiconductor layer.

10. The display panel of claim 1, further comprising a component disposed under the substrate and that corresponds to the sensor area and includes an electronic element that emits or receives light.

11. The display panel of claim 1,
wherein the auxiliary pixel circuit further includes an auxiliary connection line that electrically connects the first semiconductor layer to the second semiconductor layer,
wherein the first semiconductor layer and the second semiconductor layer are respectively disposed on different layers.

12. The display panel of claim 11, wherein
the first auxiliary thin film transistor further includes a connection electrode electrically connected to a source area or a drain area of the first semiconductor layer, and
the auxiliary connection line includes a same material as the connection electrode.

13. The display panel of claim 12, wherein
the auxiliary pixel circuit further includes a data line that transmits a data signal to the auxiliary pixel, and
the connection electrode includes a same material as the data line.

14. The display panel of claim 4, wherein
the auxiliary pixel circuit includes a first scan line and a second scan line, each transmitting a scan signal to the auxiliary pixel, and
the first scan line extends from the second gate electrode and the second scan line extends from the third gate electrode.

15. The display panel of claim 14, wherein
the auxiliary pixel circuit includes a previous scan line that transmits a previous scan signal to the fourth auxiliary thin film transistor, and
the previous scan line extends from the fourth gate electrode.

16. The display panel of claim 15, wherein the second scan line includes a same material as that of the previous scan line.

17. The display panel of claim 14, wherein
the auxiliary pixel includes a pixel electrode, and
the auxiliary pixel circuit includes a next scan line and a seventh auxiliary thin film transistor that turns on and initializes the pixel electrode in response to a next scan signal received through the next scan line,
the seventh auxiliary thin film transistor includes a seventh semiconductor layer and a seventh gate electrode that overlaps the seventh semiconductor layer, and
the next scan line extends from the seventh gate electrode.

18. The display panel of claim 17, wherein the first scan line includes a same material as the next scan line.

19. A display apparatus, comprising:
a substrate that includes a display area and a sensor area, wherein the display area includes a main pixel and the sensor area includes an auxiliary pixel,
wherein the main pixel includes a plurality of thin film transistors, and the plurality of thin film transistors each include Low Temperature Poly-Silicon (LTPS),
wherein the auxiliary pixel comprises:
a pixel electrode;
a first auxiliary thin film transistor that drives the auxiliary pixel;
a third auxiliary thin film transistor that diode-connects the first auxiliary thin film transistor;
a fourth auxiliary thin film transistor that initializes a voltage of a gate electrode of the first auxiliary thin film transistor;
a second auxiliary thin film transistor that transmits a data signal to the first auxiliary thin film transistor; and
a seventh auxiliary thin film transistor that that turns on and initializes the pixel electrode,
wherein the first auxiliary thin film transistor, third auxiliary thin film transistor and the fourth auxiliary thin film transistor each include an oxide semiconductor layer and a gate electrode that overlaps the oxide semiconductor layer, and
the second auxiliary thin film transistor and the seventh semiconductor layer each include a semiconductor layer that includes Low Temperature Poly-Silicon (LTPS) and a gate electrode that overlaps the semiconductor layer.

20. The display apparatus of claim 19, further comprising a component disposed under the sensor area of the substrate and that includes an electronic element that emits or receives light, wherein a resolution of an image displayed in the sensor area is lower than a resolution of an image displayed in the display area.

* * * * *